United States Patent
Kojima et al.

[11] Patent Number: 6,051,911
[45] Date of Patent: *Apr. 18, 2000

[54] VIBRATION WAVE ACTUATOR

[75] Inventors: Nobuyuki Kojima, Kawasaki; Ichiro Okumura, Yokohama; Yutaka Maruyama, Tokyo, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/925,083

[22] Filed: Sep. 8, 1997

Related U.S. Application Data

[63] Continuation of application No. 08/362,922, Dec. 23, 1994, abandoned.

[30] Foreign Application Priority Data

Dec. 27, 1993 [JP] Japan ................................. 5-331848
Jan. 14, 1994 [JP] Japan ................................. 6-002656

[51] Int. Cl.$^7$ .................................. H02N 2/00
[52] U.S. Cl. ..................... 310/323; 310/328; 310/359; 310/366
[58] Field of Search ................... 310/323, 328, 310/359, 366

[56] References Cited

U.S. PATENT DOCUMENTS

| | | | |
|---|---|---|---|
| 3,390,287 | 6/1968 | Sonderegger | 310/369 |
| 4,513,219 | 4/1985 | Katsuma et al. | 310/328 |
| 4,562,375 | 12/1985 | Sashida | 310/328 |
| 4,678,956 | 7/1987 | Izukawa et al. | 310/323 |
| 4,734,610 | 3/1988 | Okumura et al. | 310/323 |
| 4,742,264 | 5/1988 | Ogawa | 310/332 |
| 4,742,365 | 5/1988 | Bartky et al. | 310/328 |
| 4,759,107 | 7/1988 | Ogawa et al. | 310/328 |
| 4,763,148 | 8/1988 | Tsukimoto et al. | 310/323 |
| 4,771,203 | 9/1988 | Mukohjima et al. | 310/323 |
| 4,788,468 | 11/1988 | Izukawa et al. | 310/323 |
| 4,975,614 | 12/1990 | Honda | 310/323 |
| 5,036,240 | 7/1991 | Lew | 310/338 |
| 5,099,166 | 3/1992 | Hirano et al. | 310/323 |
| 5,124,611 | 6/1992 | Tamai et al. | 310/317 |
| 5,231,325 | 7/1993 | Tamai et al. | 310/323 |
| 5,669,127 | 9/1997 | Takahashi et al. | 310/323 |
| 5,770,916 | 6/1998 | Ezaki et al. | 310/366 |
| 5,814,919 | 9/1998 | Okumura | 310/323 |

FOREIGN PATENT DOCUMENTS

| | | | |
|---|---|---|---|
| 0450962 | 10/1991 | European Pat. Off. | H01L 41/09 |
| 0584775 | 3/1994 | European Pat. Off. | H01L 41/09 |
| 117354 | 3/1989 | Japan | H02N 2/00 |
| 4-91677 | 3/1992 | Japan | H02N 2/00 |
| 4091677 | 3/1992 | Japan | H02N 2/00 |
| 4-091677 | 3/1992 | Japan | H02N 2/00 |
| 5175567 | 7/1993 | Japan | 310/328 |
| 6165540 | 10/1994 | Japan | H02N 2/00 |

OTHER PUBLICATIONS

European Search Report dated Oct. 14, 1996.
Minoru Kurosawa, et al., "An Ultrasonic Motor Using Bending Vibrations of a Short Cylinder", *IEEE; Transactions on Ultrasonics, Ferroelectronics and Frequency Control* (vol. 36, No. 5, 1989), (p. 517 to 521). European Search Report dated May 10, 1995.

(List continued on next page.)

*Primary Examiner*—Thomas M. Dougherty
*Attorney, Agent, or Firm*—Fitzpatrick, Cella, Harper & Scinto

[57] ABSTRACT

A vibration actuator includes a vibration member; and a plurality of electromechanical energy conversion elements for vibrating the vibration member. The electromechanical energy conversion elements include a plurality of first energy conversion elements each having at least four divided electrodes. The first energy conversion elements are stacked, and electrodes, which are in phase with each other, of each energy conversion element are connected in respective regions of the energy conversion element to attain electrical connections.

15 Claims, 21 Drawing Sheets

OTHER PUBLICATIONS

English abstract of Japanese Laid Open Patent Document No. 3–40767 published May 8, 1991.

English Abstract of Japanese Laid Open Patent Document No. 3–289375 published Mar. 26, 1992.

English Abstract of Japanese Laid Open Patent Document No. 1–17354 published May 10, 1989.

Kenji Uchino, "Piezoelectric/Electrostrictive Actuator" Kyoritsu Press (pp. 78 to 81).

Japanese Official Letter/Search Report dated Mar. 16, 1998.

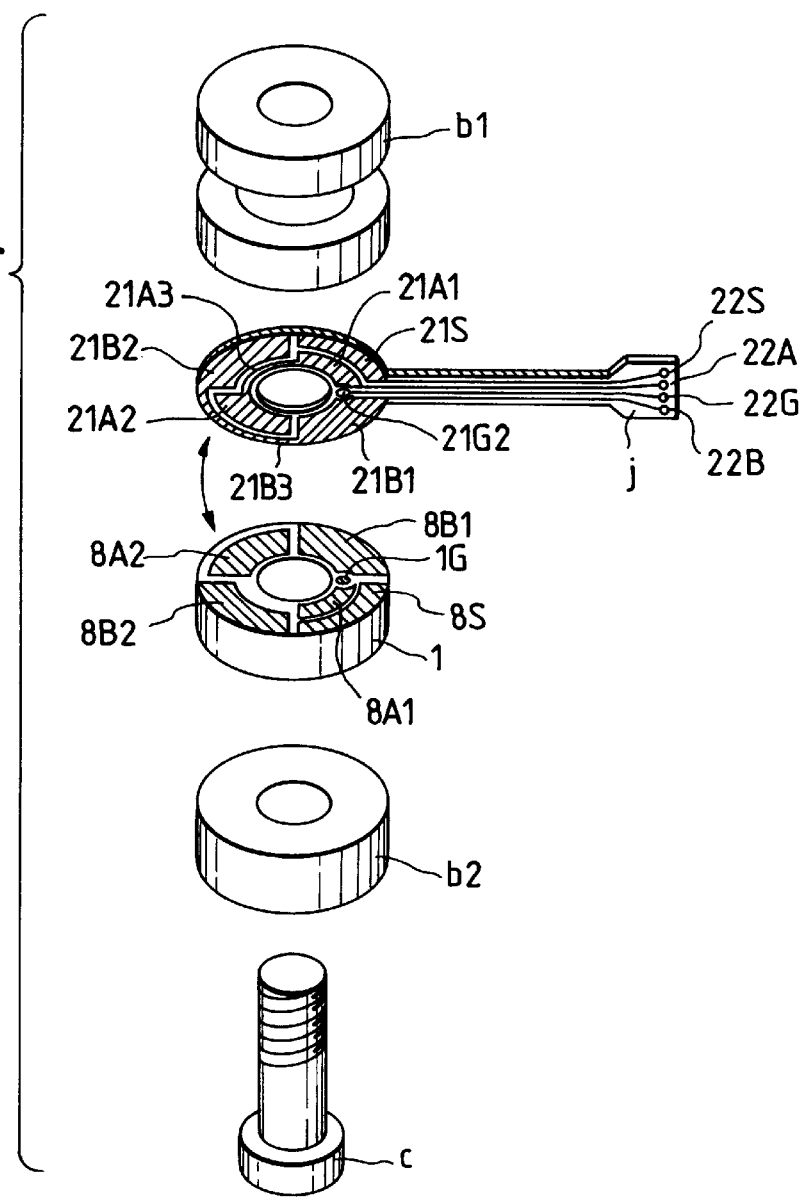
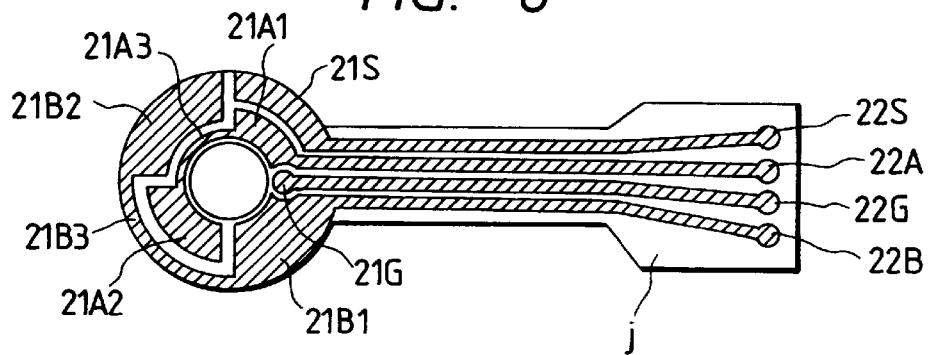

VIBRATION WAVE ACTUATOR

This application is a continuation of application Ser. No. 08/362,922 filed Dec. 23, 1994, now abandoned.

BACKGROUND OF THE INVENTION

1. Field of the Invention

The present invention relates to a vibration wave actuator and a system using the vibration wave actuator as a driving source.

2. Related Background Art

Rod-shaped ultrasonic wave motors have already been described in, e.g., Japanese Laid-Open Patent Application Nos. 3-40767, 3-289375, and the like. FIG. 13 is an exploded perspective view of a rod-shaped ultrasonic wave vibration member, and FIG. 14 is a longitudinal sectional view of a rod-shaped ultrasonic wave motor.

In the vibration member shown in FIG. 13, a driving A-phase piezoelectric member a1 consisting of a group of two piezoelectric members PZT1 and PZT2, a driving B-phase piezoelectric member a2 consisting of a group of two piezoelectric members PZT3 and PZT4, and a sensor piezoelectric member S1 consisting of a single piezoelectric member are stacked (laminated), as shown in FIG. 13, and electrode plates A1 and A2 for supplying a driving voltage signal and an electrode plate S for outputting a sensor signal are arranged among these piezoelectric members, as shown. In addition to these electrodes, GND (ground) electrode plates G1, G2, and G3 are arranged to apply a GND potential. Metal blocks b1 and b2 which consist of, e.g., brass, stainless steel, or the like and have relatively small vibration attenuation are arranged before and after these piezoelectric members and electrode plates to clamp them. By fastening the metal blocks b1 and b2 using a fastening bolt c, the piezoelectric members and electrode plates are integrated, and a compression stress is applied to the piezoelectric members. At this time, in order to use only one sensor piezoelectric member S1, an insulating sheet d is arranged between the fastening bolt c and the metal block b2.

Note that wires and the like are attached to projecting portions (tabs) of the electrode plates by soldering, and are connected to a driving circuit (not shown).

At this time, the A- and B-phase piezoelectric members a1 and a2 are arranged to have an angular positional shift of $\pi/2$ rad therebetween. When these piezoelectric members excite bending vibrations in two orthogonal in-plane directions including the axis of the vibration member to provide an appropriate time phase difference therebetween, the surface particles of the vibration member move in a circular or elliptic motion, thereby frictionally driving a movable member pressed against the upper portion of the vibration member.

FIG. 14 shows an example wherein such a vibration member is used in a rod-shaped ultrasonic wave motor. In this example, the fastening bolt c of the vibration member includes a small-diameter support column portion c2 at its distal end portion, so that a fixing member g fixed to the distal end portion of the support column portion c2 can be fixed to the motor itself. The fastening bolt c also serves to rotatably support a rotor r, and the like. The rotor r contacts the distal end portion of the metal block b1, and is compressed by pressing a coil spring h in a spring case i from the fixing member g via a bearing member e and a gear f.

The piezoelectric members used in this rod-shaped ultrasonic wave motor will be described in more detail below.

Each of the piezoelectric members PZT1 to PZT4 as independent members is formed as follows. That is, as shown in FIG. 15, a piezoelectric ceramic 200 prepared by compacting and sintering a powder is machined into a disk shape having a diameter of 10 mm, and the two surfaces of the disk are lapped to obtain a disk thickness of 0.5 mm. Two almost semi-circular divided electrode films 202-1 and 202-2 are formed via a slit 201 on the upper surface of the disk, and an electrode film 203 is formed on the entire lower surface. Thereafter, the semi-circular electrode films 202-1 and 202-2 are polarized to have different directions of polarization (+) and (−) respectively, thus providing piezoelectric characteristics. When such piezoelectric members are assembled like the A-phase piezoelectric member a1 shown in FIG. 13, the piezoelectric members PZT1 and PZT2 are stacked to sandwich the electrode plate A1 therebetween, so that portions having the same polarization face each other (arrows 205 indicate the direction of polarization), and at the same time, the slits overlap each other, as shown in FIGS. 16A and 16B.

Also, the GND electrode plates G1 and G2 are vertically stacked. In this state, when a driving AC voltage is applied to the electrode plate A1, since the right and left portions of the piezoelectric members PZT1 and PZT2 in FIGS. 16A and 16B have different polarization characteristics, if one expands, the other contracts, and this operation is alternately repeated, thus generating a bending vibration in the vibration member. Note that the B-phase piezoelectric member generates a bending vibration in substantially the same state as in the A-phase piezoelectric member, except that the direction of the slit is different by $\pi/2$ rad from that of the A-phase piezoelectric member.

However, in the above-mentioned prior art, since each piezoelectric member is manufactured by compacting and sintering a powder, performing machining, and then performing polarization processing after the electrodes are formed, the manufacture of each piezoelectric member requires much time and cost.

In consideration of handling upon machining and polarization processing of the piezoelectric member, and assembling of the vibration member, the thickness of the piezoelectric ceramic member cannot be rendered very thin because of the required mechanical strength. As a result, when the number of layers of piezoelectric members is to be further increased, a multi-layered piezoelectric member portion undesirably has a large size, and inhibits the manufacture of a compact ultrasonic wave motor having a diameter equal to or smaller than a pencil. In addition, the above-mentioned manufacturing process makes an increase in output and a decrease in driving voltage of the ultrasonic wave motor, which would be achieved by such a multi-layered structure, difficult to achieve.

As can be understood from the description of the prior art, upon assembling of the vibration member, a large number of piezoelectric members and a large number of electrode plates are alternately stacked, and thereafter, wires are attached to the end portions of the electrode plates by soldering. As a result, the assembling process requires much time, and the reliability of assembling is not satisfactory.

On the other hand, as disclosed in Japanese Patent Publication No. 1-17354, and the like, a conventional ring-shaped or disk-shaped ultrasonic wave motor has a vibration member in which electrostrictive elements or piezoelectric members are fixed to an elastic member of, e.g., a metal, which has low vibration attenuation characteristics. A movable member (contact member) is arranged in press contact with the surface of the elastic member. High-frequency voltage signals having a time phase difference therebetween are applied to the electrodes of juxtaposed electrostrictive elements or piezoelectric members, thereby (relatively) driving the movable member (contact member).

On each piezoelectric member used in this vibration member, a large number of divided electrodes are formed on one surface, and a whole-surface electrode is formed on the other surface which is joined to the elastic member. The plurality of electrodes on one surface constitute electrode groups corresponding to a plurality of phases, i.e., two, A and B phases subjected to driving signals. These electrode groups corresponding to the two phases are arranged at intervals corresponding to a ¼ wavelength or an odd-numbered multiple of the ¼ wavelength. A plurality of piezoelectric members of each group, which are subjected to polarization processing in different directions have an interval of a ½ wavelength therebetween. When a high-frequency voltage signal is applied to the piezoelectric members of each group having different directions of polarization, a vibration for one wavelength is excited. When a plurality of groups of piezoelectric members are prepared, standing waves having a wave number corresponding to the number of groups are formed, and as a result, a travelling wave having one or plural wave number is excited in the vibration member.

However, since the conventional electrostrictive element or piezoelectric member has a single-layered structure, high-frequency voltages of several ten volts must be applied to drive an ultrasonic wave motor using the piezoelectric members to obtain a practical output, the voltage of a battery as a power supply of a portable equipment such as a camera is insufficient, and a booster circuit must be prepared.

Note that a stack-type ceramic actuator which uses piezoelectric members constituted by stacking piezoelectric member plates is known [Kenji Uchino, "Piezoelectric/electrostrictive Actuator", Kyoritsu Press]. In this actuator, piezoelectric members with simple directions of polarization are merely stacked. However, when piezoelectric member plates having a complicated structure in which a large number of divided electrodes are formed and stacked with alternating directions of polarization, wiring lines for applying polarization processing and driving signals are complicated, and it is impossible to realize such an actuator.

SUMMARY OF THE INVENTION

One aspect of the invention is to provide a vibration wave actuator in which electromechanical energy conversion members each having at least four divided electrodes on one surface are stacked, and wherein electrodes which are in phase with each other are connected to each other in respective regions of the members.

BRIEF DESCRIPTION OF THE DRAWINGS

FIG. 5 is an exploded perspective view of a rod-shaped ultrasonic wave vibration member using the stacked piezoelectric member shown in FIG. 1;

FIG. 6 is a plan view showing a flexible printed board used in the rod-shaped ultrasonic wave vibration member shown in FIG. 5;

DETAILED DESCRIPTION OF THE PREFERRED EMBODIMENTS (First Embodiment)

Figure 1:
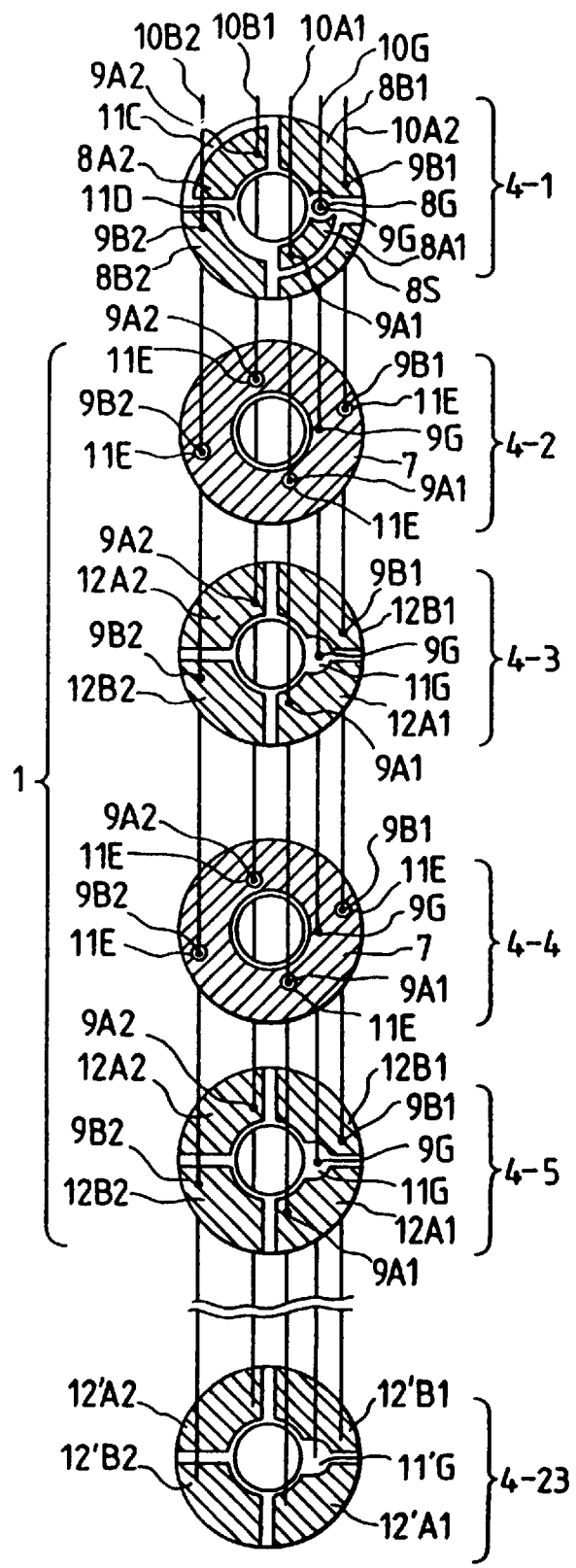
FIG. 1 is an exploded plan view showing the arrangement of a stacked piezoelectric member according to the first embodiment of the present invention.
Figure 3A:
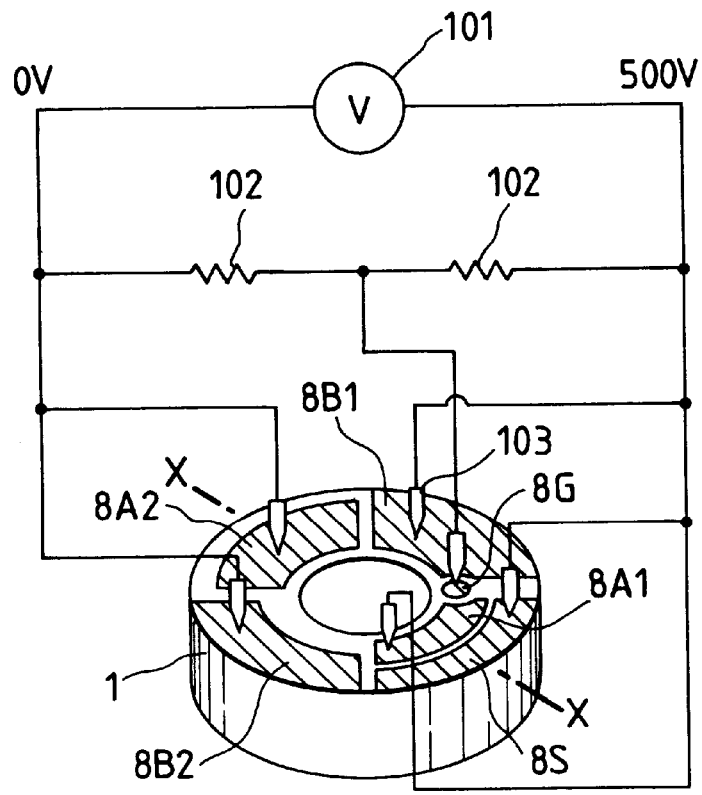
FIGS. 3A and 3B respectively are a perspective view and a sectional view showing a polarization processing method of the stacked piezoelectric member shown in FIG. 1.
Figure 3B:
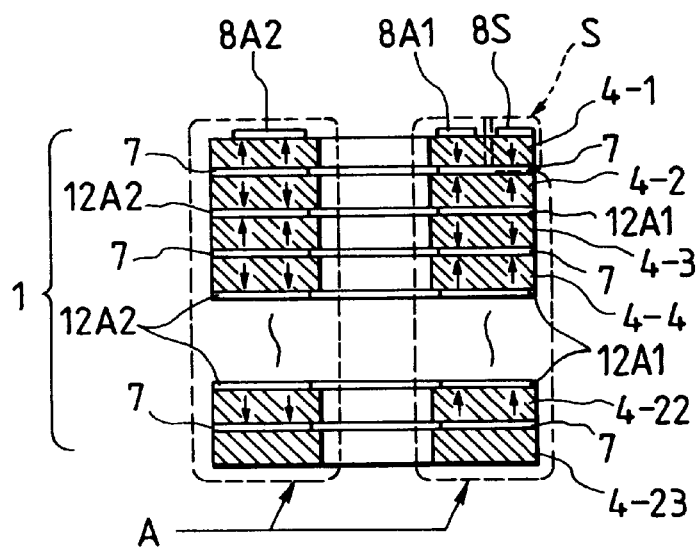

FIG. 1 shows the first embodiment of a piezoelectric member according to the present invention, and FIGS. 3A and 3B shows a polarization processing method of the piezoelectric member. FIG. 5 shows the arrangement of a rod-shaped ultrasonic wave vibration member using a stacked piezoelectric member group of this embodiment, and FIG. 6 shows a circuit board used in this embodiment.

Referring to FIG. 1, a stacked piezoelectric member group 1 is a piezoelectric ceramic which is obtained by stacking a total of 23 planar piezoelectric members 4-1, 4-2, and 4-3 to 4-23 as electro-mechanical conversion members, as shown in FIG. 1.

In each of these piezoelectric members, five connection holes 9A1, 9A2, 9B1, 9B2, and 9G extending through the thickness direction are formed. Referring to FIG. 1, a total of five divided electrode films 8A2, 8B1, 8B2, 8A1, and 8S are formed on five regions, which are obtained by substantially equally dividing the entire perimeter into four regions in the circumferential direction, and by dividing one of the divided regions into two, i.e., inner and outer peripheral regions, on the upper surface of the piezoelectric member 4-1 as the uppermost, i.e., the first layer. Also, a divided electrode film 8G smaller than the above-mentioned five divided electrode films is formed between the divided electrode films 8A1 and 8B1.

Furthermore, the five connection holes 9A1, 9A2, 9B1, 9B2, and 9G extending through the thickness direction are formed to be located in the respective regions of the divided electrode films 8A1, 8A2, 8B1, 8B2, and 8G, respectively.

An electrode film 7 is formed on substantially the entire upper surface of the piezoelectric member 4-2 as the second layer. The piezoelectric member 4-2 has non-electrode film portions 11E, where no electrode film is formed, around the connection holes 9A1, 9A2, 9B1, and 9B2. The connection hole 9G extends through the electrode film 7.

Divided electrode films 12A1, 12A2, 12B1, and 12B2 are formed on four substantially equally divided regions on the upper surface of the piezoelectric member 4-3 as the third layer. Also, the piezoelectric member 4-3 has a non-electrode film portion 11G, where no electrode film is formed, between the divided electrode films 12A1 and 12B1. The connection holes 9A1, 9A2, 9B1, and 9B2 are formed to extend through the regions of the divided electrode films 12A1, 12A2, 12B1, and 12B2, respectively, and the connection hole 9G is located in the region of the non-electrode film portion 11G.

Similarly, the same electrode film and connection holes as those of the piezoelectric member 4-2 are formed on the piezoelectric member 4-4 as the fourth layer, and the same electrode films and connection holes as those of the piezoelectric member 4-3 are formed on the piezoelectric member 4-5 as the fifth layer. On the sixth and subsequent even-numbered layers, the same electrode film and connection holes as those of the piezoelectric member 4-4 are formed, and on the seventh and subsequent odd-numbered layers, the same electrode films and connection holes as those of the piezoelectric member 4-5 are formed. On the piezoelectric member 4-23 as the lowermost, i.e., 23rd layer, four divided electrode films 12'A1, 12'A2, 12'B1, and 12'B2 are formed as in the piezoelectric member 4-3, and a non-electrode film portion 11'G is also formed. However, no connection holes are formed on the electrode film portions and the non-electrode film portion. Note that the above-mentioned electrode films are formed on only one surface of each of the piezoelectric members, and are not formed on the other surface.

The above-mentioned piezoelectric members 4 as the first to 23rd layers are stacked with the upper surfaces facing up, on which the electrode films are formed, as shown in FIG. 1, so that the electrode film portions are in phase with each other with respect to the central axis while aligning the positions of the electrode films and the connection holes 9 of the piezoelectric members, thus constituting a stacked structure. When the piezoelectric members are stacked, as described above, through holes 10A1, 10A2, 10B1, 10B2, and 10G are defined by the five connection holes 9A1, 9A2, 9B1, 9B2, and 9G in the stacked piezoelectric member group 1. When substantially the same metal electrode paste as the divided electrode films is filled in advance in the connection holes 9 upon formation of the divided electrodes, not only electrical connections in the through holes 10 can be achieved, but also electrical connections with the divided electrode films and the whole surface electrode films, which contact the connection holes can be achieved. As a result, for example, the divided electrode films of the respective layers, i.e., the divided electrode film 9A1 on the piezoelectric member 4-1 as the first layer, the divided electrode film 12A1 on the piezoelectric member 4-3 as the third layer, the divided electrode film 12A1 on the fifth layer, . . . , and the divided electrode film 12'A1 on the piezoelectric member 4-23 as the lowermost layer are electrically connected to each other via the through hole 10A1. Similarly, the electrode film 9G on the piezoelectric member 4-1 as the first layer, the whole-surface electrode film 7 on the piezoelectric member 4-2 as the second layer, the whole-surface electrode film 7 on the piezoelectric member 4-4 as the fourth layer, and the whole-surface electrode film 7 on a piezoelectric member (not shown in FIG. 1) immediately above the piezoelectric member 4-23 as the lowermost layer are electrically connected to each other via the through hole 10G. Similarly, the divided electrode films of the piezoelectric members on the odd-numbered layers can be electrically connected via the remaining through holes 10A2, 10B1, and 10B2.

In this embodiment, each piezoelectric member 4 has an outer diameter of 10 mm, an inner diameter of 4.3 mm, and a thickness of 0.1 mm, and the total thickness of the stacked piezoelectric member group 1 is 2.3 mm.

As shown in FIG. 3A, the stacked piezoelectric member group formed as described above was connected to a circuit, so that a voltage dividing operation could be achieved using two high-resistance resistors 102 of 100 MO, and contact pins 103 were brought into contact with the divided electrode films 8 on the upper end face of the stacked piezoelectric member group. A DC voltage of 500 V was applied from a DC power supply 101 to the stacked piezoelectric member group for 30 minutes in an air atmosphere of a thermostatic chamber at 140° C., thus performing polarization processing.

As a result, a voltage of 500 V is applied to the divided electrode films 8A1, 8B1, and 8S, a voltage of 250 V is applied to the divided electrode film 8G, and a voltage of 0 V is applied to the divided electrode films 8A2 and 8B2. Thus, as shown in FIG. 3B, which shows an X—X section of FIG. 3A, a region, sandwiched between the divided electrode films 8A1 and 8S and the whole-surface electrode film 7, of the piezoelectric member 4-1 as the first layer (the direction of polarization is indicated by arrows), and a region sandwiched between the divided electrode film 8A2 and the whole-surface electrode film 7 (the direction of polarization is indicated by arrows) are polarized in different directions.

Similarly, a region sandwiched between the divided electrode film 12A1 and the whole-surface electrode film 7, and a region sandwiched between the divided electrode film 12A2 and the whole-surface electrode film 7 are polarized, as shown in FIG. 3B. Although not shown, a section, which is rotated through 90° from the X—X section in FIG. 3A and cuts the divided electrode films 8B1 and 8B2, is similarly polarized.

In the stacked piezoelectric member group 1, portions extending from the divided electrode films 8A1 and 8A2 on the first layer to the lowermost layer are defined as an A phase A as a driving phase, portions extending from the divided electrode films 8B1 and 8B2 on the first layer to the lowermost layer are defined as a B phase B as a driving phase, and a portion sandwiched between the divided electrode film 8S and the whole-surface electrode film 7 is defined as an S phase S as a sensor phase. The stacked piezoelectric member group 1 is assembled and used in a rod-shaped ultrasonic wave motor.

In the piezoelectric member described in the prior art, a bending vibration is generated in the vibration member by substantially equally dividing the entire perimeter into two regions, and polarizing these two regions in opposite directions, and the A and B phases are constituted by different piezoelectric member plates. In this embodiment, the piezoelectric member as one layer of the single stacked piezoelectric member group is substantially equally divided into at least four regions, and the A and B phases are defined by the pairs of opposing divided electrodes of the four divided regions. Since the piezoelectric member is divided into four regions, a larger bending vibration than that generated by the piezoelectric member which is divided into two regions can be generated from a single stacked piezoelectric member group. More specifically, an increase in output of a rod-shaped ultrasonic wave motor depends on how effectively a displacement generated in the thickness direction of the piezoelectric member is converted into a displacement of the bending vibration of the vibration member, in terms of the basic principle, and a piezoelectric member having four divided electrode films is superior in this respect to that having two divided electrode films.

Figure 4A:
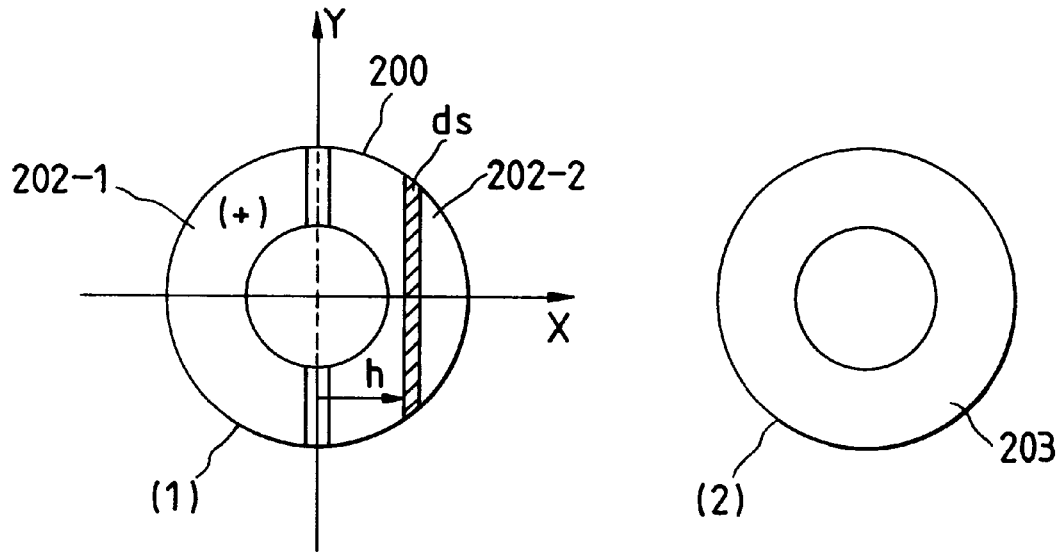
FIGS. 4A and 4B are plan views showing the arrangement of electrode films on a piezoelectric, member.

FIG. 4A shows an example as a premise of the present application. In a single piezoelectric member 200, the upper surface shown in (1) is divided into two regions, and divided electrode films 202-1 and 202-2 are formed thereon. On the lower surface shown in (2), a whole-surface electrode film 203 is formed. On the other hand, in FIG. 4B, four divided electrode films 204-1, 204-2, 205-1, and 205-2 are formed on the upper surface of a single piezoelectric member shown in (1) as in this embodiment, and a whole-surface electrode film 203 is formed on the lower surface shown in (2). A bending force α generated in a portion of one divided electrode film of the piezoelectric member 200 shown in FIG. 4A is expressed by the following formula using a product of the area of a region ds of the piezoelectric member 200 and a distance h of the region ds from the Y axis:

$$\alpha \int_s d \cdot E \cdot ds \cdot h$$

Figure 4B:
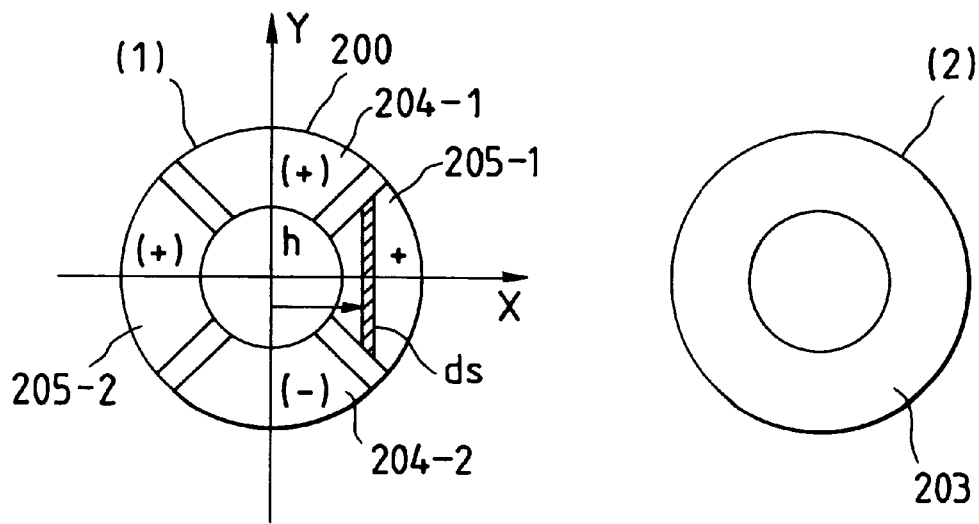

On the other hand, a bending force β generated in a portion of one divided electrode film of the piezoelectric member shown in FIG. 4B is expressed by:

$$\beta \int_s d \cdot E \cdot ds \cdot h$$

where d is a piezoelectric constant, E is the applied voltage, h is the distance of the region ds from the Y axis, and a slit portion is ignored since its area is small. As a result, the ratio γ between displacements, which generate bending vibrations of the vibration members, of the piezoelectric members shown in FIGS. 4A and 4B is calculated to be $\gamma = 4\beta/2\alpha = \sqrt{2}$, and the piezoelectric member having four divided electrode films generates a bending force $\sqrt{2}$ times that generated by the piezoelectric member having two divided electrode films.

This result suggests that the bending amount of the vibration member of the rod-shaped ultrasonic wave motor is increased, and an increase in output of the rod-shaped ultrasonic wave motor can be realized. Alternatively, if the output remains the same, the applied voltage can be decreased to $1/\sqrt{2}$, and a low-voltage driving operation can be realized. For the above-mentioned reasons, almost all of the layers of the stacked piezoelectric member have substantially four divided electrodes.

In the prior art, the S phase is realized by a single piezoelectric member. However, as shown in FIG. 3B, the divided electrode film 8S is formed at the outer periphery side of the divided electrode film 8A1 on the first layer, and the portion constituted between the divided electrode film 8S and the whole-surface electrode film 7 between the first layer and the surface of the second layer is used as the S phase. The S phase is incorporated in the single stacked piezoelectric member group 1.

In this embodiment, the S phase is formed on the outer periphery side using a half of one divided electrode of the A phase on the upper surface of the first layer. With this arrangement, since a distortion at the outer periphery side of the stacked piezoelectric member group becomes larger upon driving of the rod-shaped ultrasonic wave motor, a larger output of the sensor can be easily obtained accordingly. However, the position and size of the S phase are not particularly limited as long as the output from the S phase is enough in control. For example, the S phase may be arranged on the inner periphery side of the A phase or on both the two divided electrodes of the A phase, or may be arranged in the B phase or both the A and B phases. Furthermore, the position of the S phase is not limited to the uppermost layer of the stacked piezoelectric member group as long as the output of the S phase can be output to a circuit outside the member. The S phase may be omitted if no problem is posed in control.

In this embodiment, the number of layers in the stacked piezoelectric element group is 23. However, the number of layers is not particularly limited, and must be determined on the basis of various conditions, such as the specifications of the rod-shaped ultrasonic wave motor, the required performance of a vibration member, the specification of a driving circuit portion, and the like.

An embodiment of a vibration member in which the stacked piezoelectric member group 1 of this embodiment is assembled will be described below.

FIG. 5 is an exploded perspective view of a rod-shaped ultrasonic wave vibration member using the stacked piezoelectric member group 1 of this embodiment. The vibration member is constituted by the stacked piezoelectric member group 1, upper and lower vibration elements b1 and b2 consisting of a metal material, a printed board j which is electrically connected to the stacked piezoelectric member group 1 to connect an external control circuit, and a fastening bolt c for integrating these members.

As the printed board j, a flexible printed board consisting of a high-polymer sheet was used. As shown in FIG. 6, the printed board j is constituted by a disk portion inserted in the vibration member, and a connection portion to be connected to an external portion. On the disk portion, board electrodes 21 are arranged at positions contacting the divided electrode films 8 formed on the upper surface of the stacked piezoelectric member group 1, and a pattern 21A3 for electrically connecting the board electrodes 21A1 and 21A2, and a pattern 21B3 for electrically connecting the board electrodes 21B1 and 21B2 are also arranged. Connection terminals 22 to be connected to an external control circuit are arranged on the connection portion of the printed board j, and the electrodes 21A1, 21B1, 21G, and 21S are respectively connected to the terminals 22A, 22B, 22G, and 22S via a printed wiring pattern. When the vibration member is assembled, as shown in FIG. 5, the board electrode 21A1 and the divided electrode 8A1 and the board electrode 21A2 and the divided electrode 8A2 are respectively brought into contact with each other to be electrically connected, and the remaining board electrodes and divided electrodes are similarly brought into contact with each other to be electrically connected.

To summarize, when the divided electrode films 8 on the uppermost layer of the stacked piezoelectric member group are electrically connected to the terminals 22S, 22A, 22G, and 22B on the end portion of the printed board j, and these terminals are connected to a rod-shaped ultrasonic wave motor driving circuit portion, the vibration member generates proper bending vibrations as the rod-shaped vibration wave motor, and the sensor phase can feedback an output required for a control function of the driving circuit.

The printed board j shown in FIG. 6 uses a 25-μm thick polyimide film as a base and a 35-μm thick copper foil as an electrode material, and a printed board material without an adhesive layer is used between the base and the electrode material. This is to prevent an increase in vibration attenuation due to the presence of a resin material or the like in the vibration member.

The stacked piezoelectric member group 1 described in this embodiment achieves electrical connections with an external circuit on one end face. With this structure, the number of connection members such as a printed board arranged in the ultrasonic wave vibration member can be 1, and a vibration member with a simple arrangement and high reliability can be realized.

As described in this embodiment, the stacked piezoelectric member group can achieve a decrease in voltage and a decrease in the number of components. Such effects lead to a decrease in the number of processes, and a decrease in cost. At the same time, the number of contact interfaces among the components can be decreased, and a good vibration member with less vibration attenuation can be provided.

(Second Embodiment)

Figure 2:
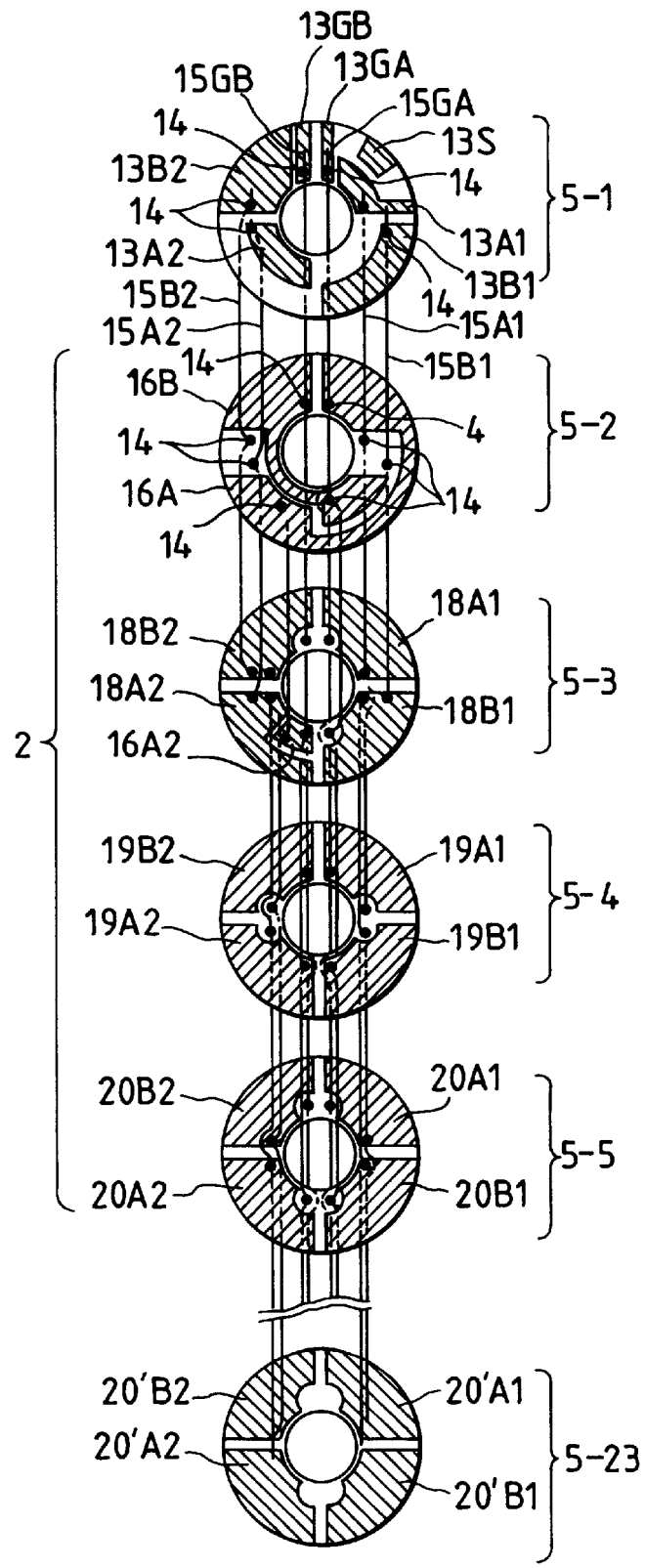
FIG. 2 is an exploded plan view showing the arrangement of a stacked piezoelectric member according to the second embodiment of the present invention.

FIG. 2 shows the second embodiment.

A stacked piezoelectric member group 2 shown in FIG. 2 is constituted by stacking 23 piezoelectric members 5 as in the first embodiment.

The stacked piezoelectric member group 2 is constituted by six different types of piezoelectric members 5. Piezoelectric members 5-1, 5-2, 5-3, 5-4, 5-5, and 5-23 have different divided film arrangements and different connection hole arrangements. Of the sixth to 22nd layers, even-numbered layers have the same arrangement as that of the fourth layer (5-4), and odd-numbered layer have the same arrangement as that of the fifth layer (5-5).

On the uppermost layer (first layer 5-1), seven divided electrode films 13A1, 13A2, 13B1, 13B2, 13S, 13GA, and 13GB are formed.

On the even-numbered layers of the fourth to 22nd layers, four substantially equally divided electrode films 19A1, 19A2, 19B1, and 19B2 are formed, and the electrode films denoted by the same reference symbols are connected via connection holes 14 and through holes 15. Electrode films 16A and 16B on the second layer and an electrode film 16A2 on the third layer respectively connect the electrode films 19A1 and 19A2, and the electrode films 19B1 and 19B2, and also connect them to the electrode films 13GA and 13GB on the first layer thereabove.

Also, on the odd-numbered layers of the fifth to 23rd (lowermost) layer, four substantially equally divided electrode films 20A1 (20'A1), 20A2 (20'A2), 20B1 (20'B1), and 20B2 (20'B2) are formed, and the electrode films denoted by the same reference symbols are connected via connection holes. These electrode films are connected to the electrode films 13A1, 13A2, 13B1, and 13B2 on the first layer via the electrode films 18A1, 18A2, 18B1, and 18B2 on the third layer.

Figure 7A:
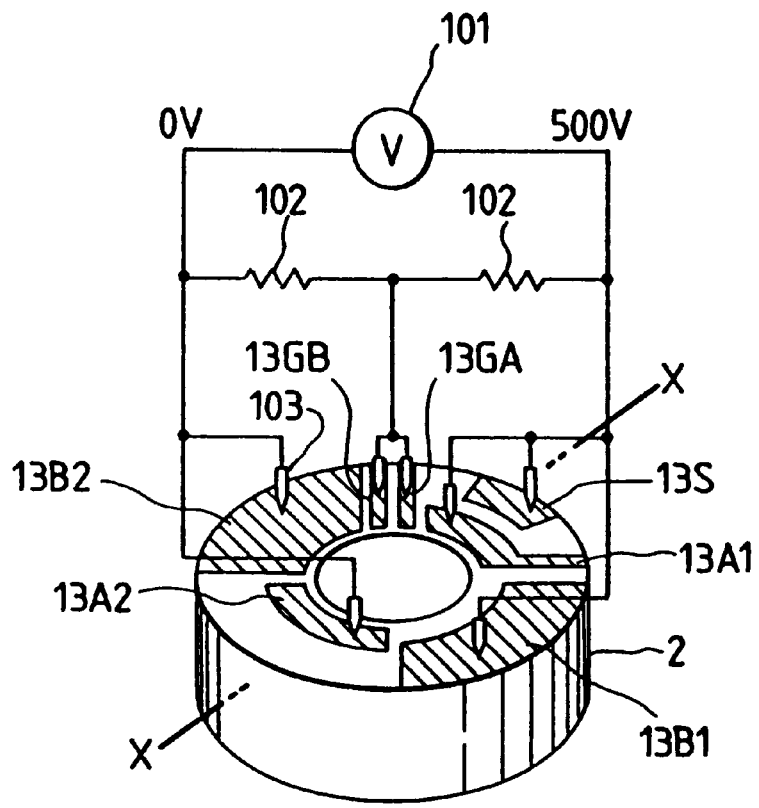
FIGS. 7A and 7B respectively are a perspective view and a sectional view showing a polarization processing method of the stacked piezoelectric member shown in FIG. 2.

As shown in FIG. 7A, the stacked piezoelectric member group formed as described above was connected to a circuit, so that a voltage dividing operation could be achieved using two high-resistance resistors 102 of 100 MΩ, and contact pins 103 were brought into contact with the divided electrode films 13 on the upper end face of the stacked piezoelectric member group 2.

Figure 7B:
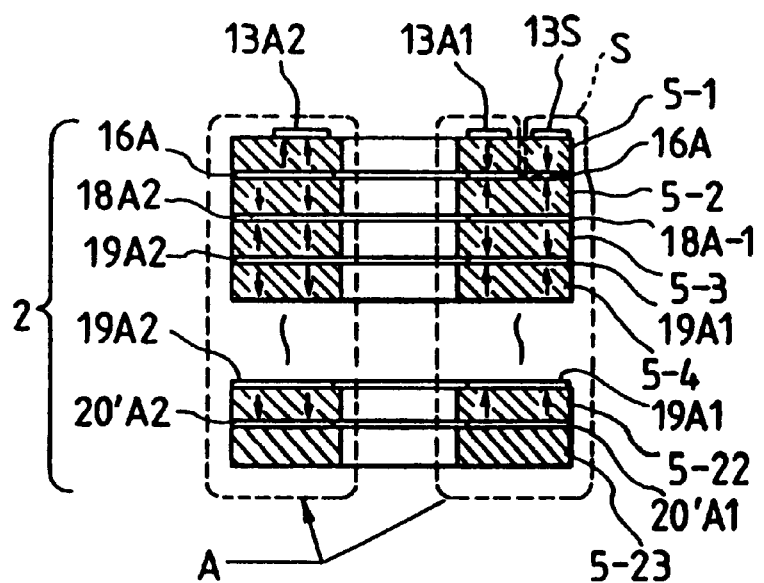

A DC voltage of 500 V was applied from a DC power supply 101 to the stacked piezoelectric member group for 30 minutes in an air atmosphere of a thermostatic chamber at 140° C., thus performing polarization processing. As a result, since a voltage of 0 V is applied to the divided electrode films 13A2 and 13B2, a voltage of 250 V is applied to the divided electrode films 13GA and 13GB, and a voltage of 500 V is applied to the divided electrode films 13A1, 13B1, and 13S, the piezoelectric members 5 are polarized in the directions of arrows shown in FIG. 7B.

Figure 8:
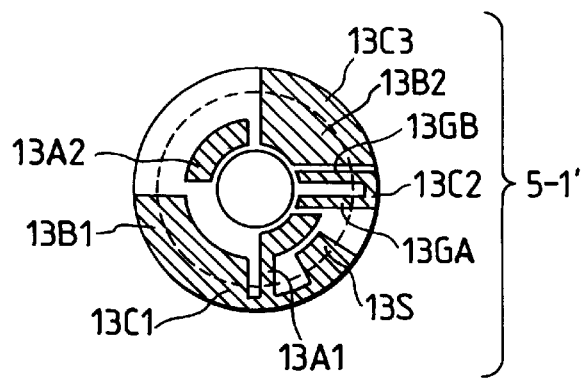
FIG. 8 is a view showing another arrangement of the stacked piezoelectric member shown in FIG. 2.

In order to polarize the stacked piezoelectric member group of this embodiment, the seven contact pins must be brought into contact with the stacked piezoelectric member group, as shown in FIG. 7A. However, the outer diameter of the piezoelectric member group 2 is about 10 mm, and it is difficult to arrange these contact pins within this area. FIG. 8 shows an example which can solve this problem. As the piezoelectric member on the uppermost layer, a piezoelectric member 5-1' having electrodes with shapes shown in FIG. 8 is used. An alternate long and short dashed circle in FIG. 8 indicates the finished outer diameter size, and each piezoelectric member 5 is formed into a disk shape larger than this size. On the piezoelectric member 5-1', four divided electrode film portions, i.e., the divided electrode films 13S, 13A1, and 13B1 connected via an electrode film 13C1, which extends to the outer periphery portion beyond the above-mentioned alternate long and short dashed circle, the divided electrode films 13GA and 13GB connected via a similar electrode film 13C2, the divided electrode film 13B2 connected to a similar electrode film 13C3, and the divided electrode film 13A2 which is located at the inner periphery side and is left unchanged, are formed.

Therefore, the number of polarization contact pins can be four. When the outer diameter is reduced to the alternate long and short dashed circle position after polarization, the same piezoelectric member as in FIG. 2 can be obtained.

Figure 9:
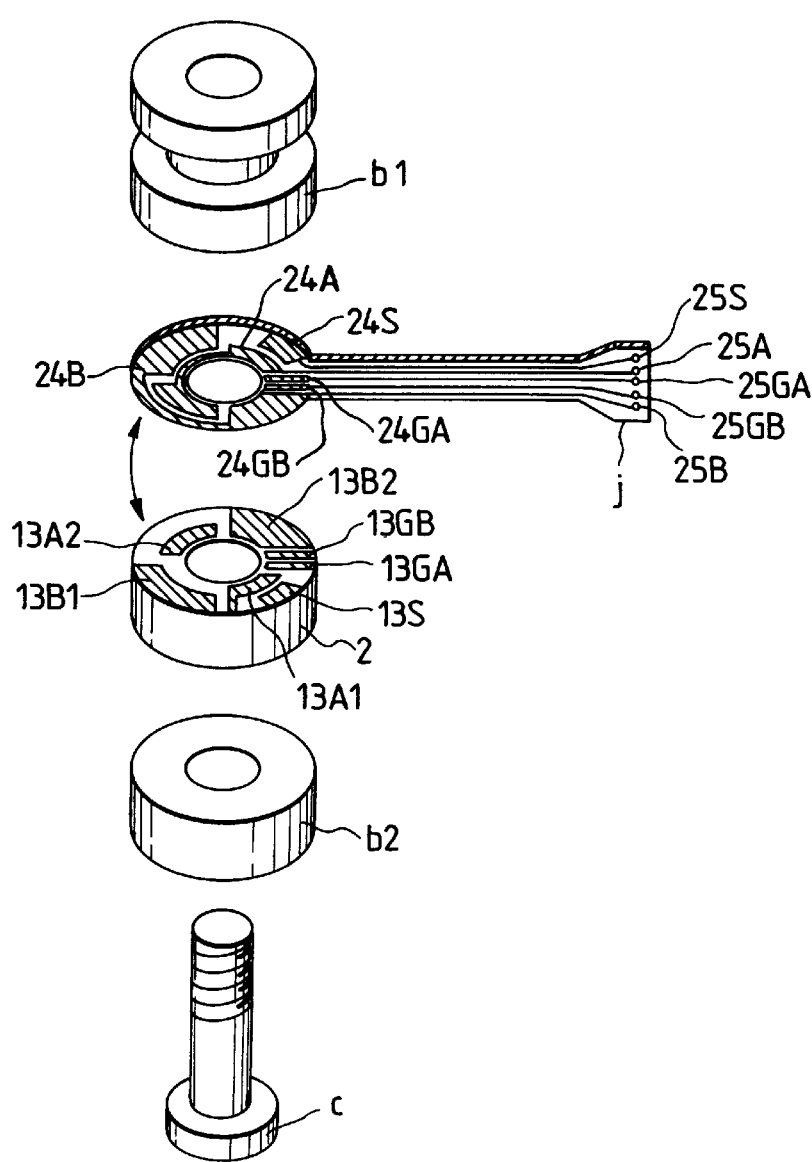
FIG. 9 is an exploded perspective view of a rod-shaped ultrasonic wave vibration member using the stacked piezoelectric member shown in FIG. 2.
Figure 10:
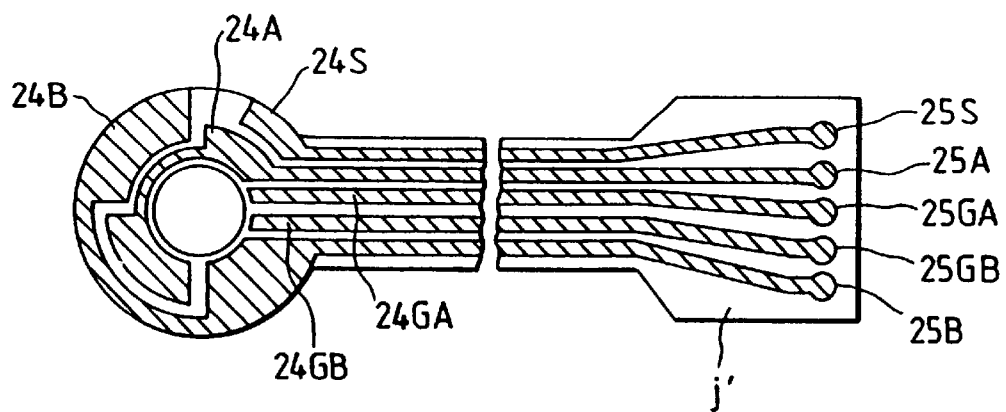
FIG. 10 is a plan view showing a flexible printed board used in the rod-shaped ultrasonic wave vibration member shown in FIG. 9.

FIG. 9 shows a rod-shaped ultrasonic wave vibration member using the stacked piezoelectric member group of this embodiment, which member has the same arrangement as the vibration member described in the first embodiment. FIG. 10 shows the electrode arrangement on a printed board used in the rod-shaped ultrasonic wave vibration member of this embodiment.

In this embodiment, a flexible printed board j' is used as the printed board. Board electrodes 24 are arranged on the disk portion of the printed board j' at positions contacting the divided electrode films 13 formed on the upper surface of the stacked piezoelectric member group 2. The board electrode 24A is electrically connected to the divided electrode films 13A1 and 13A2. Similarly, the board electrode 24B is electrically connected to the divided electrode films 13B1 and 13B2. Similarly, the board electrodes 24GA and 24GB are electrically connected to the divided electrode films 13GA and 13GB, respectively. Connection terminals 25 to be connected to an external control circuit are arranged on the connection portion of the printed board j', and the terminals 25S, 25A, 25B, 25GA, and 25GB are respectively connected to the electrodes 24S, 24A, 24B, 24GA, and 24GB via a printed pattern.

The printed board j' is arranged in the vibration member, so that the board electrodes contact the surface with the divided electrode films of the stacked piezoelectric member group, as shown in FIG. 9. With this arrangement, the connection terminal 25A of the printed board j' is electrically connected to the divided electrode films 13A1 and 13A2 of the stacked piezoelectric member group 2, and applies an A-phase potential thereto. Similarly, the connection terminal 25GA is connected to the divided electrode film 13GA of piezoelectric member group 2, and applies an A'-phase potential as a GND phase of the A phase thereto. Similarly, the connection terminal 25B applies a B-phase potential, and the connection terminal 25GB applies a B'-phase potential as a GND phase of the B phase. The connection terminal 25S outputs an S-phase potential.

The S phase is unnecessary if it is not required for the control function, and in this case, the connection terminals 13S, 24S, and 25S can be omitted.

As described above, in the stacked piezoelectric member group of this embodiment, the whole-surface electrode film corresponding to the GND phase in the first embodiment is divided into four regions as in the opposing four divided electrode films, unlike in the first embodiment, and the GND phases facing the A and B phases are independently arranged.

Figure 11:
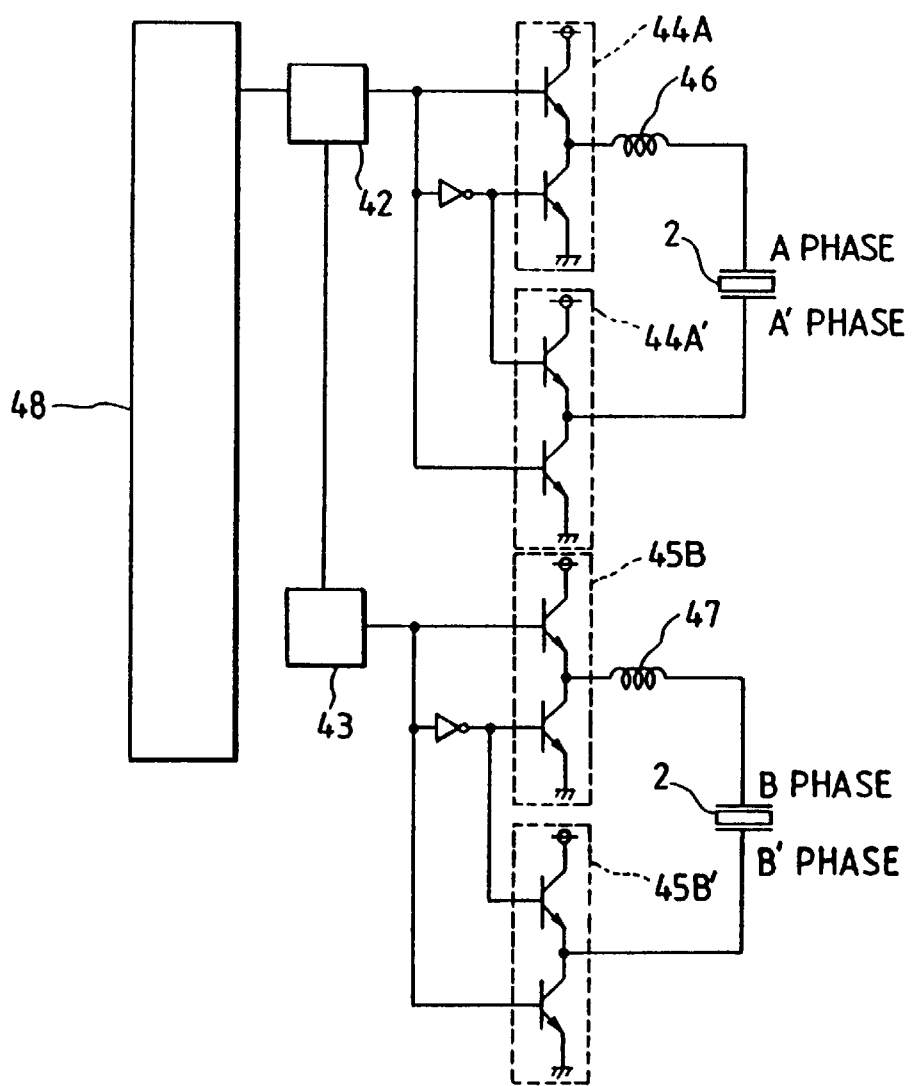
FIG. 11 is a circuit diagram showing the arrangement of a driving circuit for an ultrasonic wave motor used in the second embodiment.
Figure 17:
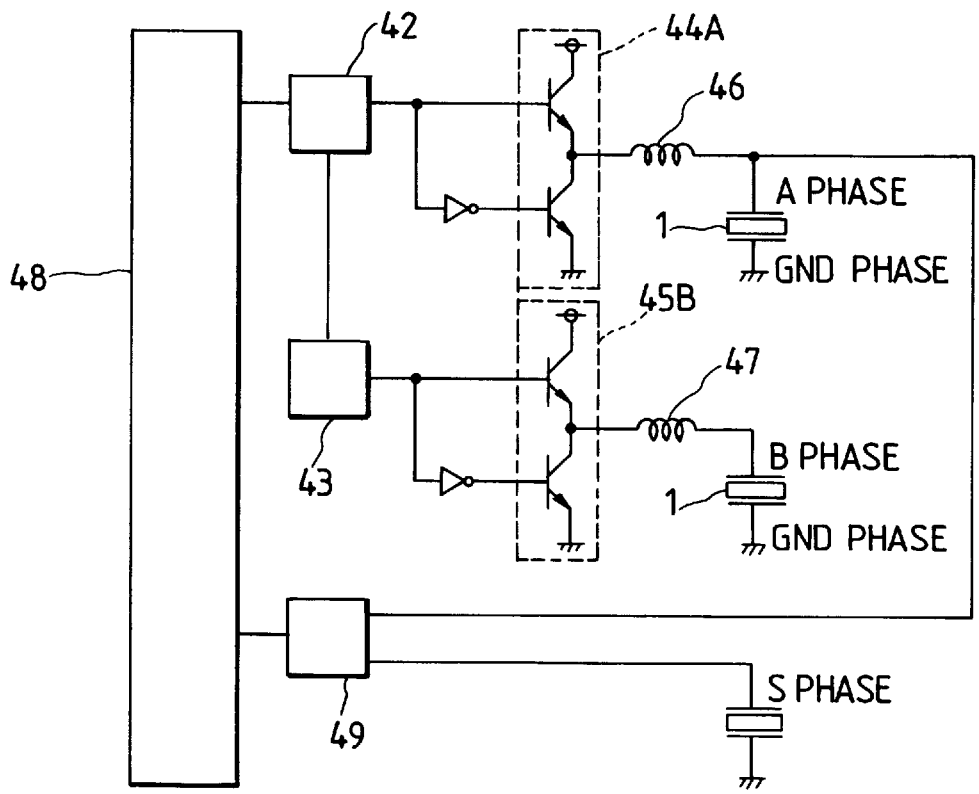
FIG. 17 is a circuit diagram showing the arrangement of a driving circuit for an ultrasonic wave motor used in the first embodiment.

FIG. 17 shows a driving circuit used in the first embodiment. FIG. 11 shows a driving circuit used in the second embodiment.

The driving circuit shown in FIG. 17 comprises driving electrodes A and B for applying alternate voltages to the stacked piezoelectric member group, a driving electrode GND for applying a GND potential to the stacked piezoelectric member group, oscillators 42 for generating alternate voltages, 90° phase shifters 43, switching circuits 44A and 45B for switching alternate voltages from the oscillators and the phase shifters by a power supply voltage, and booster coils 46 and 47 for amplifying pulse voltages switched by the switching circuits 44A and 45B.

A description will be made while taking the A phase as an example. A voltage output from the switching circuit 44A is applied to the driving electrode A located at the end face of the stacked piezoelectric member group 1, which constitutes the A phase. Since the driving electrode GND located at the other end face of the stacked piezoelectric member group 1 is at the GND potential, the voltage applied to the stacked piezoelectric member group 1 is a voltage output from the switching circuit 44A. The same applies to the B phase.

The driving circuit shown in FIG. 11 comprises driving electrodes A, A', B, and B' for applying alternating voltages to the stacked piezoelectric member group 2, an oscillator 42 for generating an alternating voltage, a π/2 rad phase shifter 43, switching circuits 44A, 44A', 45B, and 45B' for switching alternating voltages from the oscillator and the phase shifter by a power supply voltage, booster coils 46 and 47 for amplifying pulse voltages switched by the switching circuits 44A, 44A', 45B, and 45B', and a control microcomputer 48.

The control microcomputer 48 supplies an instruction to the oscillator to generate an alternating voltage with a frequency at which the ultrasonic wave motor is to be driven. At this time, signals whose phases are shifted by a rad are input to the switching circuits 44A, 44A', 45B, and 45B', and these switching circuits are switched at these timings.

A description will be made while taking the A phase as an example. A voltage output from the switching circuit 44A is applied to the driving electrode A located at the end face of the stacked piezoelectric member group 2, which constitutes the A phase, and a voltage output from the switching circuit 44A' is applied to the driving electrode A'. A voltage difference between these voltages corresponds to the driving voltage to be applied to the stacked piezoelectric member group 2. The voltages output from the switching circuits 44A and 44A' are shifted by π rad, and the driving voltage to be applied to the stacked piezoelectric member group 2 can be twice as large as that of a circuit arrangement (e.g., FIG. 17) which uses the driving electrode A' as a GND potential. The same applies to the B phase. For this reason, the power supply voltage of the second embodiment can be half that in the first embodiment.

The coils 46 and 47 may be omitted if they are not required for control function.

Figure 12:
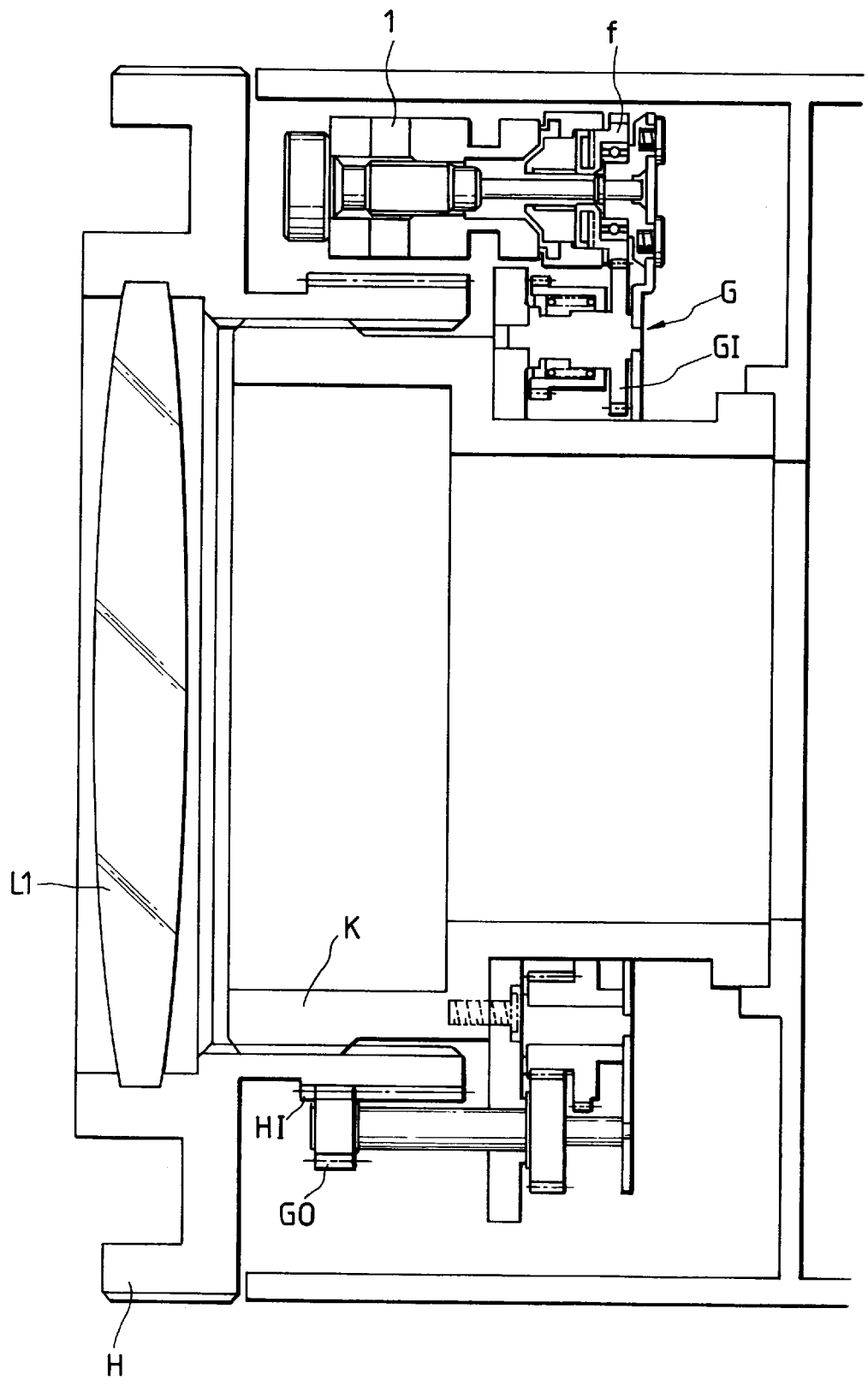
FIG. 12 is a sectional view of a lens barrel in which a lens driving mechanism, which uses a rod-shaped ultrasonic wave motor having the stacked piezoelectric member shown in FIG. 1 or 2 as a driving source, is assembled.
Figure 13:
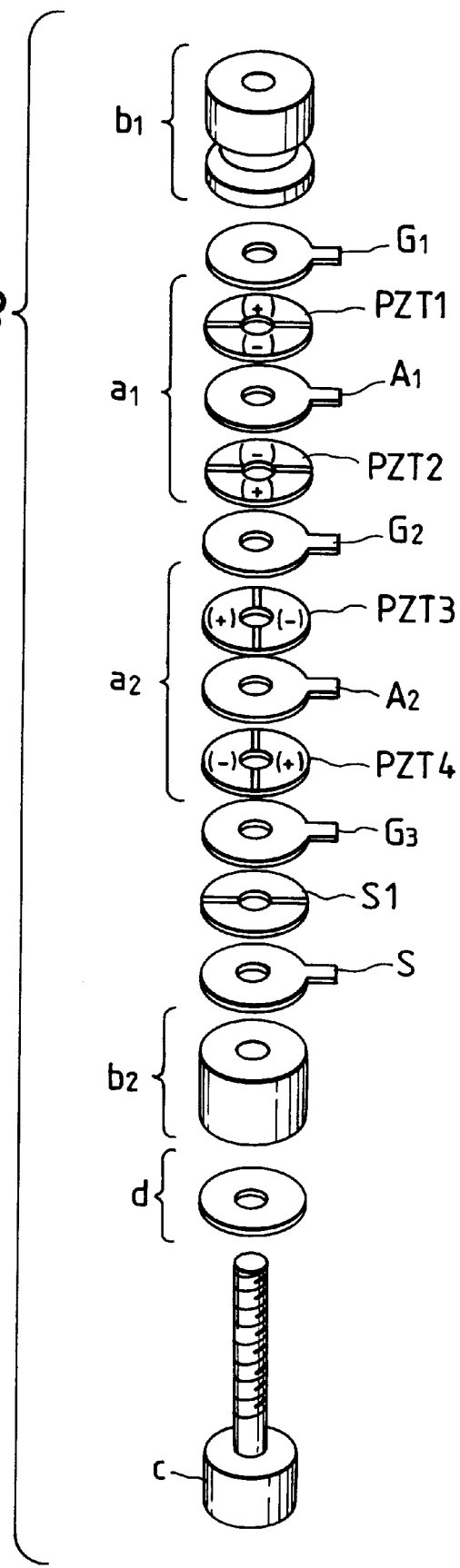
FIG. 13 is an exploded perspective view of a conventional rod-shaped ultrasonic wave vibration member.

FIG. 12 shows a driving device (system) using a rod-shaped ultrasonic wave motor in which the stacked piezoelectric member group 1 according to the present invention is assembled.

Figure 14:
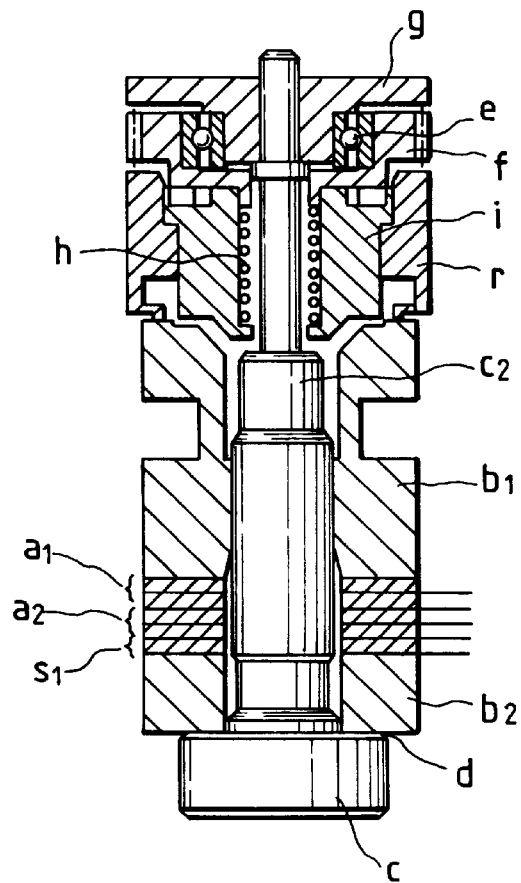
FIG. 14 is a sectional view of a conventional rod-shaped ultrasonic wave motor.
Figure 15:
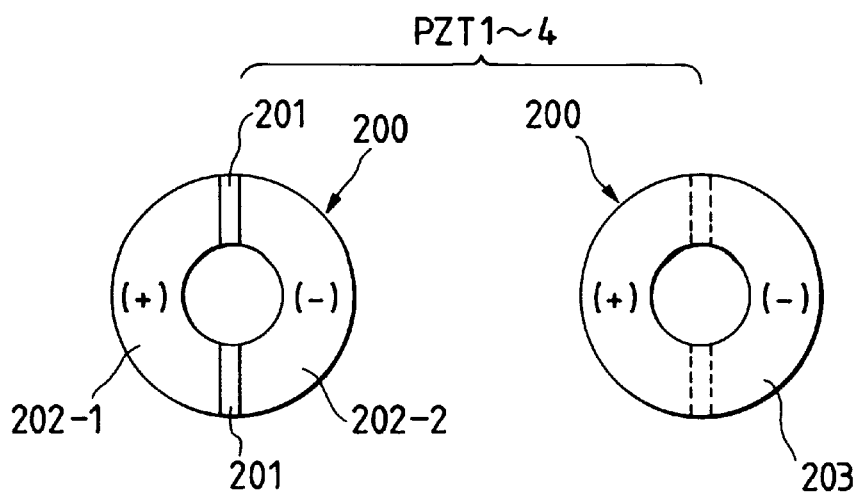
FIG. 15 is a plan view showing the structure of a conventional piezoelectric ceramic.
Figure 16A:
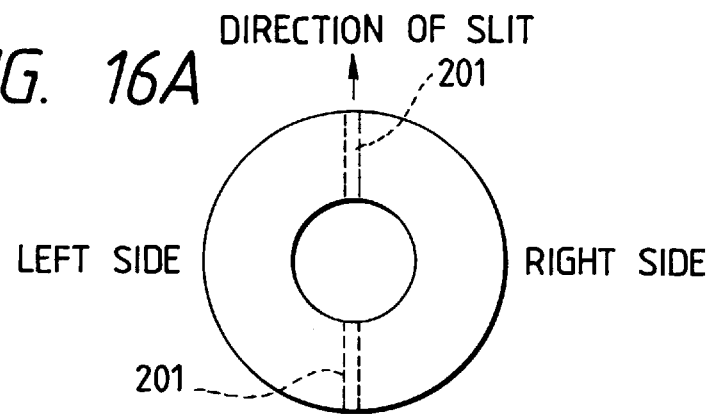
FIGS. 16A and 16B are plan views showing an operation of the conventional piezoelectric ceramic.
Figure 16B:
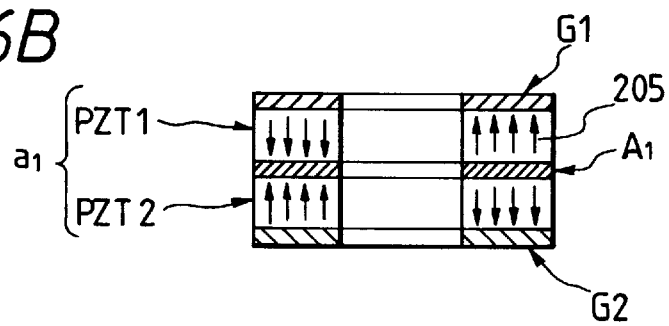

The basic structure of this rod-shaped ultrasonic wave motor is substantially the same as that of the prior art shown in FIG. 14, except for the stacked piezoelectric member group and the circuit board inserted in the vibration member to achieve connections with an external circuit. A gear f which is assembled integrally with the rotor of the ultrasonic wave motor meshes with an input gear GI of a gear transmission mechanism G, and an output gear GO of the mechanism G meshes with a gear HI formed on a lens holding member H which holds a lens L1. The lens holding member H is helicoid-coupled to a stationary cylinder K, and is rotated via the gear transmission mechanism G by a driving force from the ultrasonic wave motor, thus performing a focusing operation.

As described above, in the above-mentioned embodiments, since the four divided electrode films are formed, a sufficient driving operation can be assured even by a low voltage. When the stacked piezoelectric member group of each of the above embodiments is used in a rod-shaped ultrasonic member, a compact, large-output motor can be provided.

Since a flexible printed board or the like is inserted to achieve connections between the rod-shaped ultrasonic wave motor and the driving circuit, easy assembling and high reliability of the vibration member can be assured.

Furthermore, polarization processing for four or more divided electrode films can be achieved by the same operation as the polarization operation for the four divided electrode films, and unnecessary portions need only be cut after the polarization processing.

(Third Embodiment)

Figure 18:
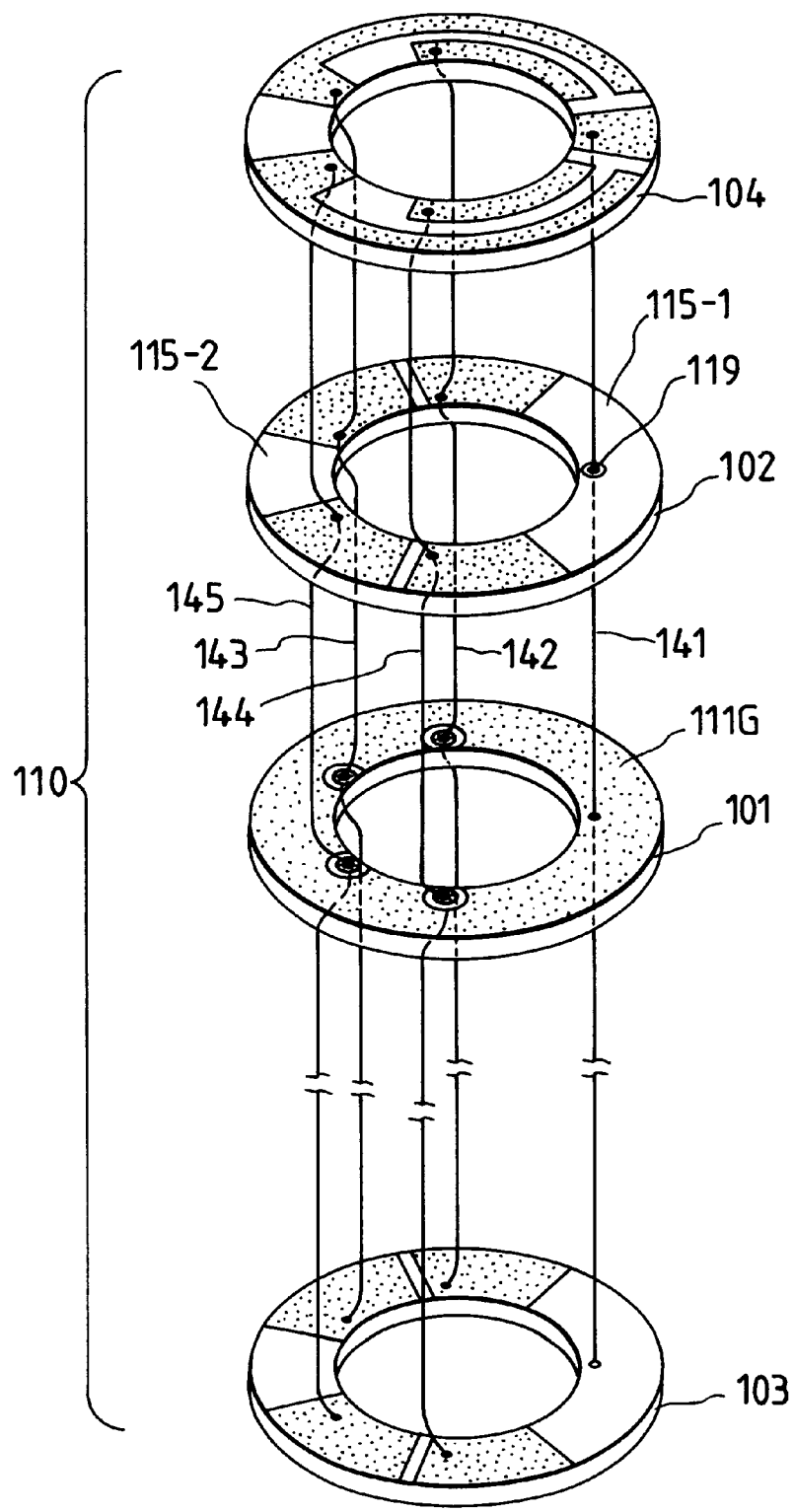
FIG. 18 is an exploded perspective view of a stacked piezoelectric member according to the third embodiment of the present invention.
Figure 19A:
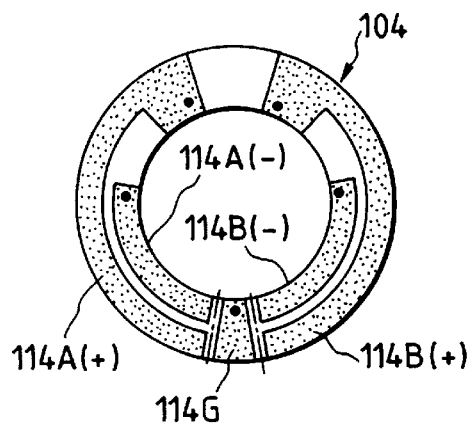
FIGS. 19A to 19F are plan views showing electrodes of piezoelectric member plates which constitute the stacked piezoelectric member shown in FIG. 18.
Figure 19D:
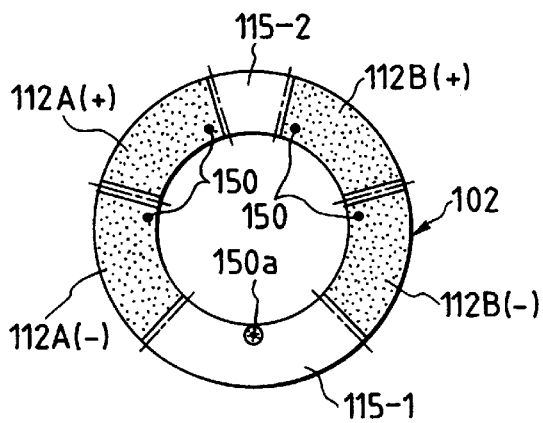
Figure 19B:
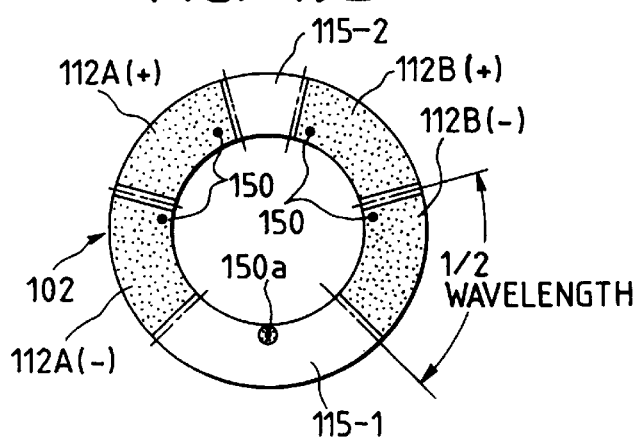
Figure 19E:
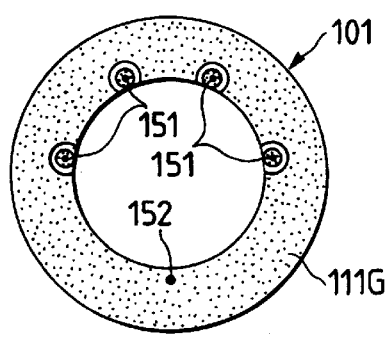
Figure 19C:
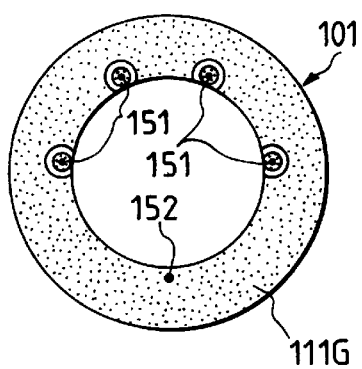
Figure 19F:
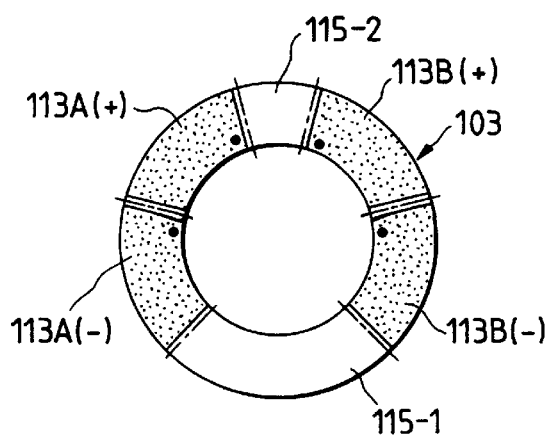

FIG. 18 is an exploded perspective view showing the third embodiment of a stacked piezoelectric member group according to the present invention, and FIGS. 19A to 19F are plan views of electrodes formed on one-surface side of piezoelectric ceramic plates constituting the stacked piezoelectric member group shown in FIG. 18.

The stacked piezoelectric member group of this embodiment is constituted by stacking six planar piezoelectric members each consisting of a ring-shaped piezoelectric ceramic shown in FIGS. 19A to 19F, and these piezoelectric members are classified into three different types of elements depending on electrode patterns formed on one-side surface sides of the piezoelectric ceramic plates.

Figure 23:
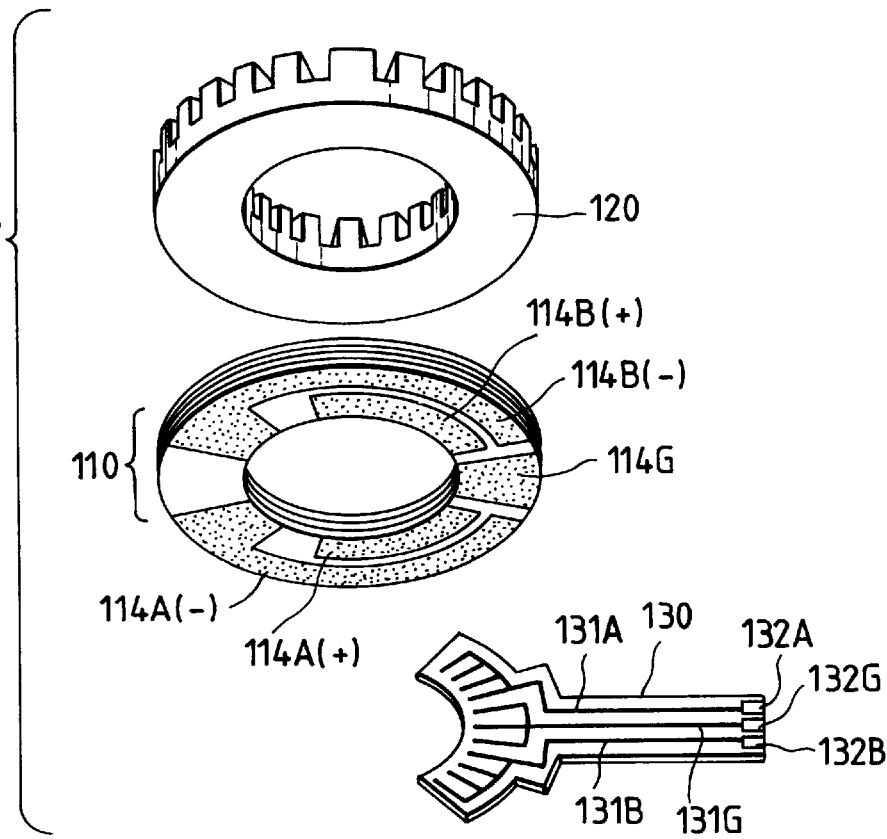
FIG. 23 is an exploded perspective view of a vibration member of an ultrasonic wave motor which uses the stacked piezoelectric member shown in FIG. 18.

On an uppermost piezoelectric member 104, which has a first electrode pattern, a GND electrode 114G for grounding (GND) is formed to have a length of a ¼ wavelength (λ) in the circumferential direction, and A-phase power supply electrodes 114A (114A(+) and 114A(−)), and B-phase power supply electrodes 114B (114B(+) and 114B(−)) are formed on the two sides of the GND electrode 114G. The reason why the power supply electrodes 114A(−) and 114B(−) at the inner periphery side are formed to be shorter than the power supply electrodes 114A(+) and 114B(+) at the outer periphery side is that portions, polarized in the (+) direction, of A and B phases (to be described later) are arranged at positions separated from the GND electrode 114G farther than the portions polarized in the (−) direction. Since one end of each of these power supply electrodes is arranged in the vicinity of the GND electrode 114G, it can be connected to a flexible printed board 130 to be connected to a driving circuit (not shown) with a compact structure, as shown in FIG. 23.

Piezoelectric members having a second electrode pattern are a second piezoelectric member 102, a fourth piezoelectric member 102, and a sixth (lowermost) piezoelectric member 103 (FIGS. 19B, 19D, and 19F) from the top position. On each of these piezoelectric members, with reference to the GND electrode 114G on the uppermost piezoelectric member 104, a first non-electrode portion 115-1, which has a length of a ¾ wavelength (λ) to have the same center as the circumferential center of the GND electrode 114G and on which no electrode is formed, is arranged, and a second non-electrode portion 115-2, which has a length of a ¼ wavelength (λ) and on which no electrode is formed, is arranged at a position symmetrical with the first non-electrode portion 115-1. Between these non-electrode portions, A-phase positive and negative electrodes 112A(+) (113A(+)) and 112A(−) (113A(−)), and B-phase positive and negative electrodes 112B(+) (113B(+)) and 112B(−) (113B(−)) are formed at the two sides to each have a length of a ½ wavelength.

The difference between the second and fourth piezoelectric members 102 and the sixth (lowermost) piezoelectric member 103 is that connection holes 150 through which connection lines 142 to 145 extend while contacting the electrodes are formed in the second and fourth piezoelectric members arranged between the first (uppermost) piezoelectric member 104 and the lowermost piezoelectric member 103, and a connection hole 150a through which a connection line 141 for electrical connection extends is also formed in the first non-electrode portion. Other arrangements of these piezoelectric members are the same.

Piezoelectric members having a third electrode pattern are third and fifth piezoelectric members 101 (FIGS. 19C and 19E) from the top position. On each of these members, a GND electrode 111G is formed on the entire surface, and through holes 151 through which the connection lines 142 to 145 extend not to be in contact with the GND electrode 11G, and a through hole 152 through which the connection line 141 extends to be in contact with the electrode 111G are formed.

The six piezoelectric members 101, 102, 103, and 104 with the above arrangements are stacked with the arrangement phases shown in FIGS. 19A to 19F. The connection line 141 is electrically connected to the GND electrode 114G of the first layer, and the GND electrodes 111G of the third and fifth piezoelectric members 101, the connection line 142 is electrically connected to the electrodes 114B(−), 112B(−), and 113B(−) on the second, fourth, and sixth piezoelectric members 102 and 103, the connection line 143 is electrically connected to the electrodes 114B(+), 112B(+), and 113B(+), the connection line 144 is electrically connected to the electrodes 114A(−), 112A(−), and 113A(−), and the connection line 145 is electrically connected to the electrodes 114B(+), 112B(+), and 113B(+).

For the sake of easy understanding, in the above description, the electrodes of the stacked piezoelectric members are electrically connected via the connection lines 141 to 145. However, in practice, these electrical connections are achieved by through holes. With this structure, conductive lines need not be connected to every other layers, and projections formed by a conductive paint coated on the outer edge portions can be avoided.

Figure 20:
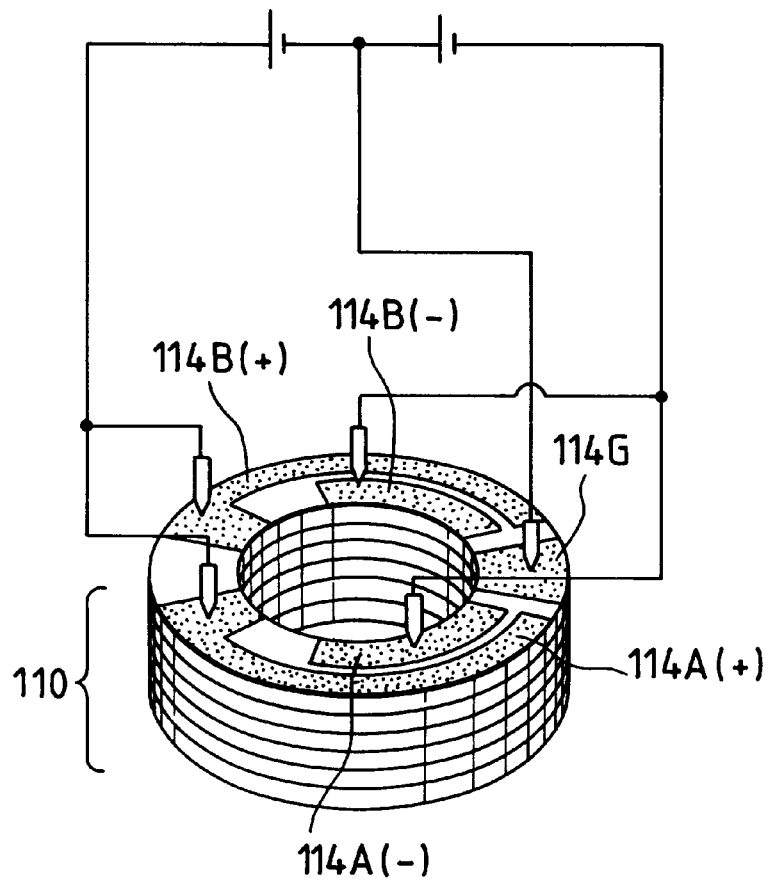
FIG. 20 is a perspective view showing a polarization processing method of the stacked piezoelectric member shown in FIG. 18.

FIG. 20 is a schematic view showing the polarization processing method of the stacked piezoelectric ceramic plates shown in FIG. 18.

All contact pins for the polarization processing are brought into contact with the electrodes on the uppermost piezoelectric member 104, and positive and negative voltages with respect to the GND electrode 114G are respectively applied to the positive electrodes 114A(+) and 114B (+) of the A and B phases and the negative electrodes 114A(−) and 114B(−) of the A and B phases. The whole-surface electrodes 111G on the third and fifth piezoelectric members 101 are applied with a polarization voltage via a through hole (represented by the connection line 141 in FIG. 18) electrically connected to the GND electrode 114G on the uppermost piezoelectric member 104. Also, the positive electrodes 112A(+) (113A(+)) and 112B(+) (113B(+)) on the second, fourth, and sixth piezoelectric members 102 and 103, which are arranged to sandwich the third and fifth piezoelectric members 101 therebetween, are applied with the polarization processing voltage via through holes (represented by the connection lines 143 and 145 in FIG. 18) electrically connected to the electrodes 114A(+) and 114B(+) on the uppermost piezoelectric member 104, and the negative electrodes 112A(−) (113A(−)) and 112B(−) (113B(−)) on these piezoelectric members are applied with the polarization processing voltage via through holes (represented by the connection lines 142 and 144 in FIG. 18) electrically connected to the electrodes 114A(−) and 114B(−) on the uppermost piezoelectric member 104.

Figure 21:
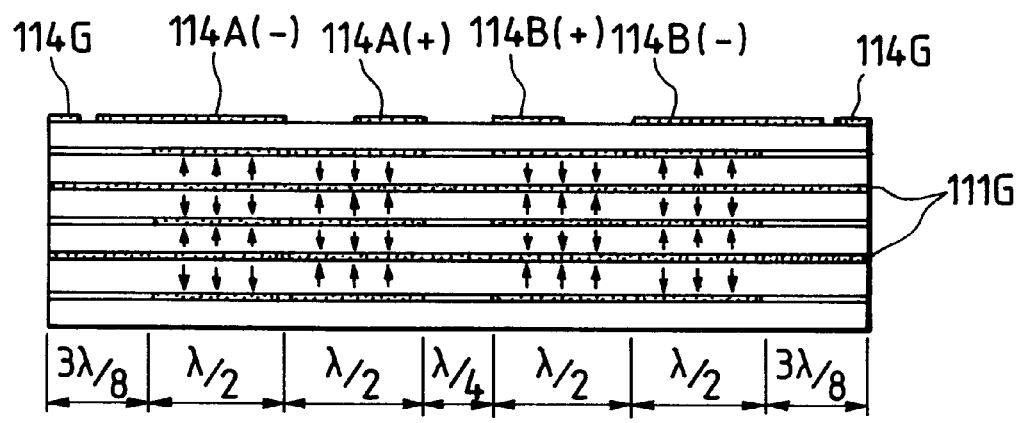
FIG. 21 is a developed view showing the directions of polarization of the stacked piezoelectric member shown in FIG. 18.

FIG. 21 is a developed view (developed at the center of the electrode 114G) showing the polarization state of a stacked piezoelectric member group 110, which is subjected to the polarization processing shown in FIG. 20. In FIG. 21, arrows indicate the directions of polarization.

Note that the piezoelectric members (ceramic plates) to be subjected to the polarization processing are the second, third, fourth, and fifth piezoelectric members (ceramic plates). The polarization processing is performed toward the GND electrode 111G between the positive electrodes 112A (+) (113A(+)) and 112B(+) (113B(+)) to which a high-potential voltage with respect to the GND electrode 111G is applied, and the polarization processing is performed from the GND electrode 111G toward the negative electrodes 112A(−) (113A(−)) and 112B(−) (113B(−)) between the negative electrodes 112A(−) (113A(−)) and 112B(−) (113B(−)).

Therefore, when a positive voltage is applied across the positive power supply electrodes 114A(+) and 114B(+), and the GND electrode 114G on the uppermost piezoelectric member 104 of the stacked piezoelectric member group 110 subjected to the above-mentioned polarization processing, portions corresponding to the positive electrodes 112A(+) (113A(+)) and 112B(+) (113B(+)) of the intermediate piezoelectric members (ceramic plates) contract in the thickness direction. On the other hand, when a negative voltage is applied across the negative power supply electrodes 114A (−) and 114B(−), and the GND electrode 114G, portions corresponding to the negative electrodes 112A(−) (113A(−)) and 112B(−) (113B(−)) of the intermediate piezoelectric members (ceramic plates) expand in the thickness direction. Therefore, when alternating voltages are applied to these power supply electrodes, expansion/contraction is repeated, thus exciting a vibration.

In FIG. 23, the stacked piezoelectric member group 110 is fixed to the lower surface side of a ring-shaped vibration elastic member 120 via an adhesive, and a flexible board 130 for connection is adhered to the power supply electrodes of the first piezoelectric member 104. The flexible board 130 is connected to a driving circuit (not shown), an A-phase power supply pattern 131A is connected to the A-phase power supply electrodes 114A(+) and 114A(−), a B-phase power supply pattern 131B is connected to the B-phase power supply electrodes 114B(+) and 114B(−), and a GND power supply pattern 131G is connected to the GND electrode 114G.

When alternating voltages having a phase difference are input from a driving circuit (not shown) to a terminal portion 132A on the other end side of the A-phase power supply pattern 131A and a terminal portion 132B on the other end side of the B-phase power supply pattern 131B, since the A and B phases have a ¼ positional phase difference therebetween, an elliptic motion is formed on surface particles on the driving surface of the vibration elastic member 120. Therefore, when a vibration member constituted by the stacked piezoelectric member group 110 and the vibration elastic member 120 is used as a stator, and a rotor (not shown) is in press contact with the driving surface of the vibration elastic member 120, the vibration member can be utilized in an ultrasonic motor which rotates the rotor. On the other hand, when a sheet member such as a paper sheet is in press contact with the driving surface of the vibration elastic member 120, the vibration member can be utilized as a sheet feeder. Furthermore, when the stacked piezoelectric member group and the vibration elastic member 120 are formed into an elongated elliptic shape, and one linear portion of the elliptic shape is in press contact with a rail-shaped stator (not shown), the vibration member can be utilized in a linear driving device. In this manner, the vibration member can be utilized in various vibration wave driving devices.

Figure 22:
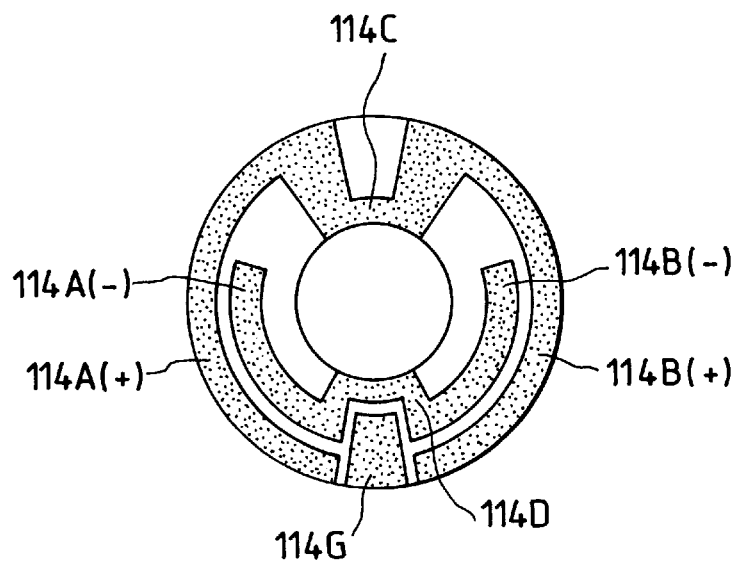
FIG. 22 is a plan view of the electrodes of the uppermost piezoelectric member plate according to a modification of the embodiment shown in FIG. 18.

With the polarization processing method shown in FIG. 20, different contact pins are brought into contact with the positive and negative electrodes of the A and B phases, and voltages of the same potential are applied thereto. Alternatively, as shown in FIG. 22, the positive power supply electrodes 114A(+) and 114B(+) on the uppermost piezoelectric member 104 are connected to each other in advance, and the negative power supply electrodes 114A(−) and 114B(−) are connected to each other in advance, thus reducing the number of contact pins to be connected. After the polarization processing, by cutting connecting connection portions 114C and 114D, the same stacked piezoelectric member group as that shown in FIG. 18 can be obtained.

Figure 24A:
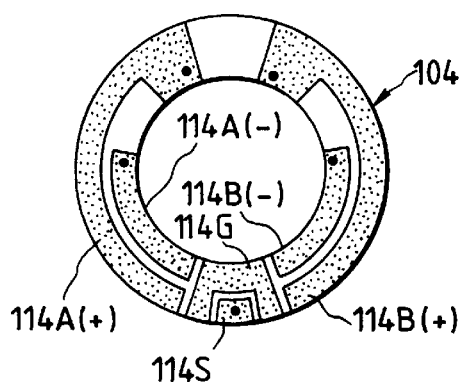
FIGS. 24A to 24F are plan views showing electrodes of the piezoelectric member plates according to a modification of the embodiment shown in FIGS. 19A to 19F.
Figure 24D:
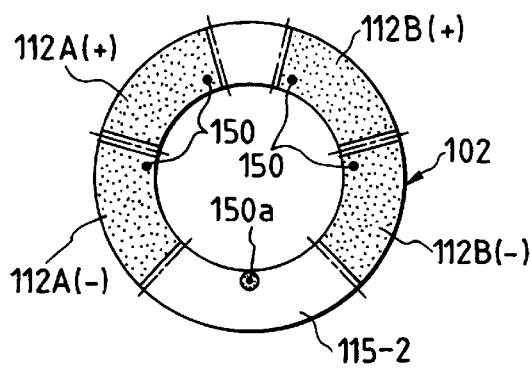
Figure 24B:
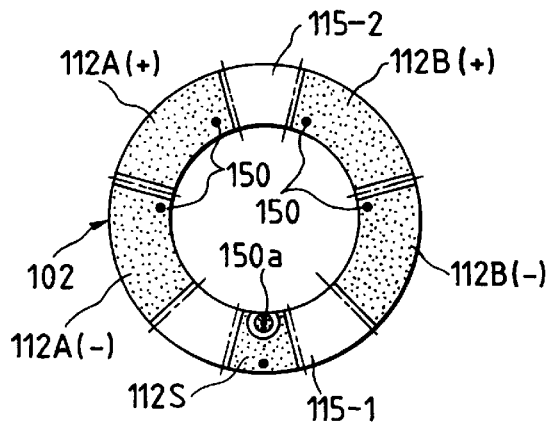
Figure 24E:
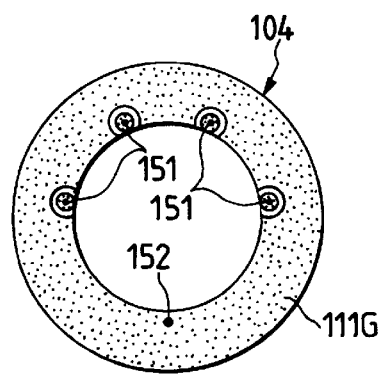
Figure 24C:
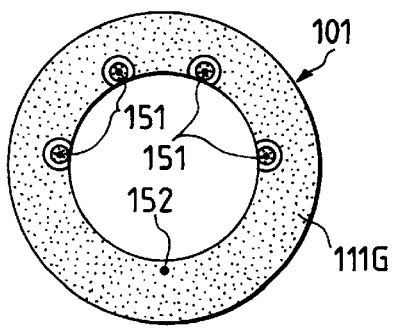
Figure 24F:
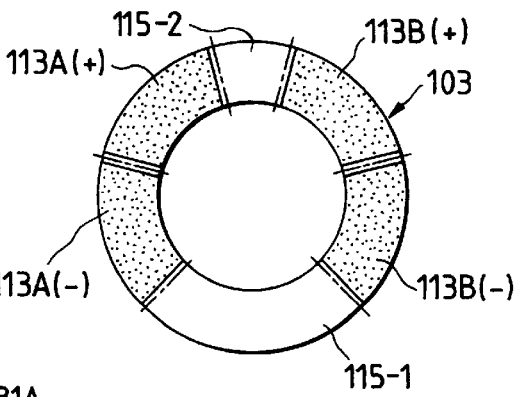

The stacked piezoelectric member group 110 shown in FIG. 18 has no sensor phase for detecting a vibration state. As shown in FIG. 24B, a sensor electrode 112S having a width of a ¼ wavelength is arranged on the first non-electrode portion 115-1 so as not to contact the connection hole 150a, and an electrode 114S which is electrically connected to the sensor electrode 112S via, e.g., a through hole is formed on the uppermost piezoelectric member 104.

Therefore, when a positive or negative voltage is applied to the electrode 114S in the polarization processing, polarization processing for the sensor is performed between the electrode 114S and the electrode 111G on the third piezoelectric member 101. If the electrode 114S is connected to another power supply electrode, e.g., the power supply electrode 114A(+) via the outer periphery portion, no wiring for the sensor need be especially prepared for the polarization processing.

Figure 25:
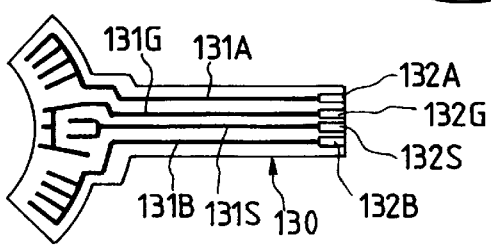
FIG. 25 is a plan view of a flexible printed board for connection used in the stacked piezoelectric member shown in FIGS. 24A to 24F.
Figure 26A:
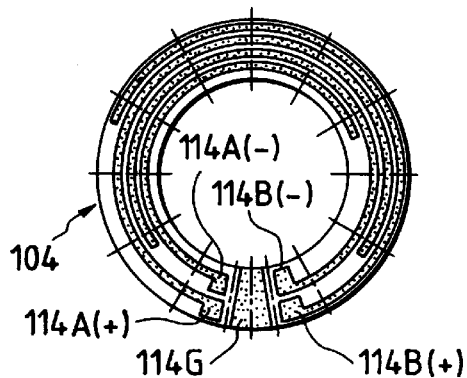
FIGS. 26A to 26F are plan views showing electrodes of piezoelectric member plates which constitute a stacked piezoelectric member according to the fourth embodiment of the present invention.
Figure 26D:
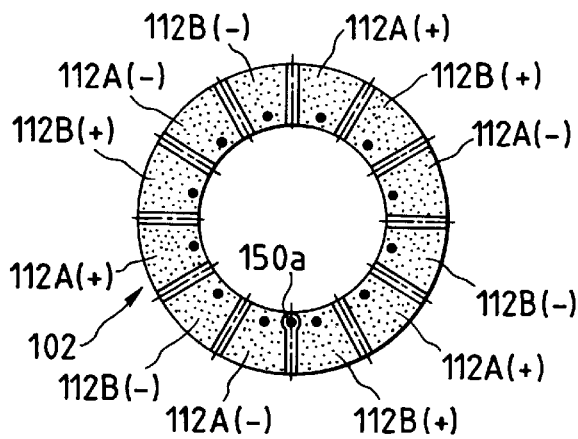
Figure 26B:
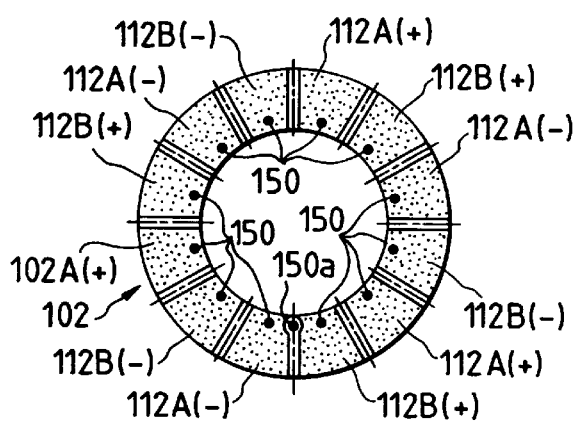
Figure 26E:
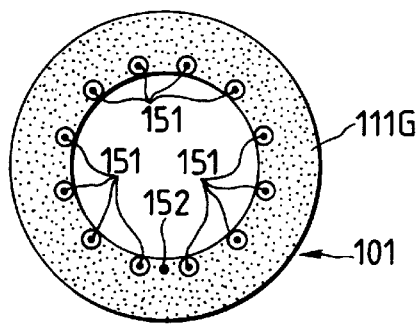
Figure 26C:
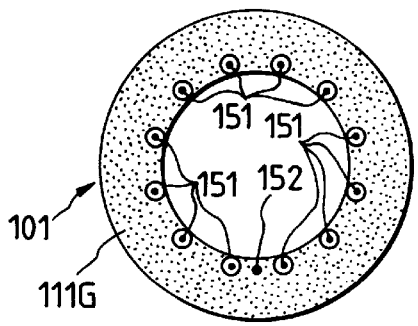
Figure 26F:
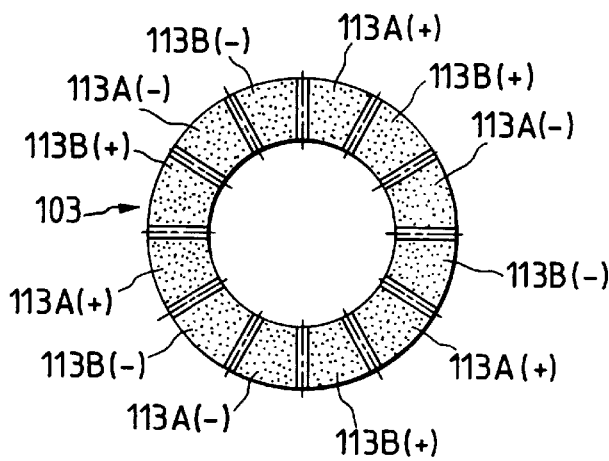

On the flexible printed board 130 connected to a driving circuit for driving, an S-phase power supply pattern 131S is arranged not to contact the GND power supply pattern 131G, as shown in FIG. 25.

(Fourth Embodiment)

FIGS. 26A to 26F show the fourth embodiment.

A stacked piezoelectric member group of this embodiment is constituted by six piezoelectric members (ceramic plates), as in the embodiment shown in FIGS. 19A to 19F. A difference from the arrangement of the third embodiment is that electrodes are formed on the entire perimeter at intervals of a ¼ wavelength on one surface of each of second, fourth, and sixth piezoelectric members 102 and 103 shown in FIGS. 26B, 26D, and 26F. Since positive electrodes 112A(+) (113A(+)) and negative electrodes 112A(−) (113A(−)) of the A phase, and positive electrodes 112B(+) (113B(+)) and negative electrodes 112B(−) (113B(−)) of the B phase are alternately arranged, the A and B phase have an interval of a ¼ wavelength therebetween as a whole.

Therefore, since each piezoelectric member (ceramic plate) can be utilized over the entire perimeter, the same output can be obtained at a lower voltage than the third embodiment described above.

In this embodiment, since A- and B-phase electrodes are alternately arranged on the entire perimeter of each of the second, fourth, and sixth piezoelectric members 102 and 103 described above, power supply electrodes formed on a first piezoelectric member 104, which is arranged on the uppermost layer for polarization processing and power supply, are arranged as four inner and outer peripheral, concentrical portions, and can be connected to through holes of the second and subsequent piezoelectric members as in the third embodiment.

One end side of each of these power supply electrode 114A(+), 114A(−), 114B(+), and 114B(−) is arranged in the vicinity of a GND electrode 114G, and this structure facilitates simultaneous connections with a flexible printed board as in the third embodiment.

Note that an electrode for detecting a vibration state may be arranged on a portion of the second piezoelectric member, as shown in FIGS. 24A to 24F.

(Fifth Embodiment)

FIGS. 27A to 27F show the fifth embodiment.

Figure 27A:
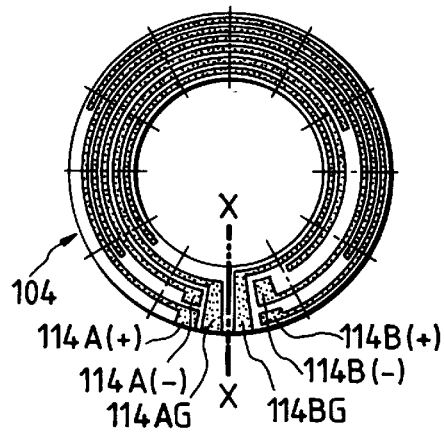
FIGS. 27A to 27F are plan views showing electrodes of piezoelectric member plates which constitute a stacked piezoelectric member according to the fifth embodiment of the present invention.
Figure 27D:
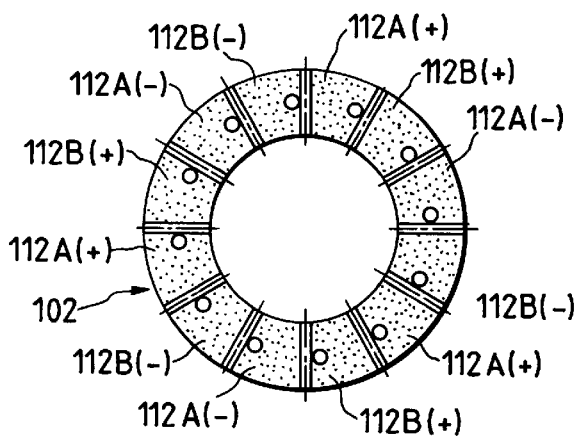
Figure 27B:
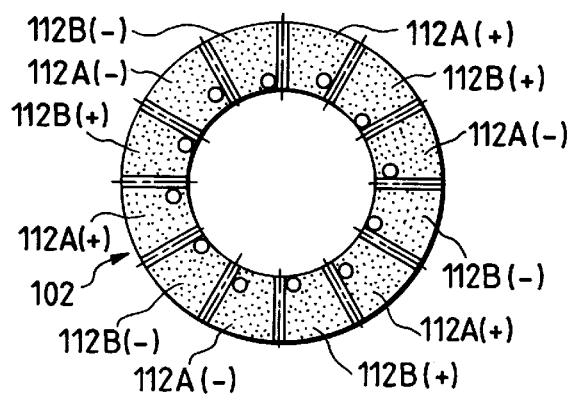
Figure 27E:
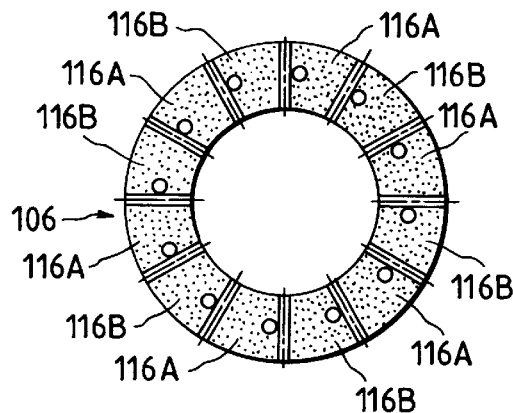
Figure 27C:
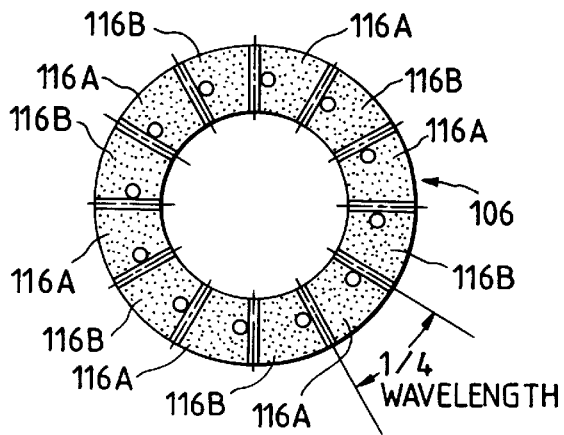
Figure 27F:
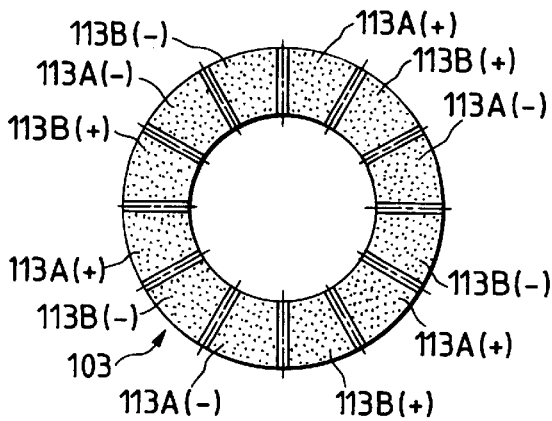

In this embodiment, as shown in FIGS. 27B, 27D, and 27F, electrodes are formed on the entire perimeter at ¼-wavelength intervals on each of second, fourth, and sixth piezoelectric members 102 and 103 as in the fourth embodiment shown in FIGS. 26A to 26F. However, on third and fifth piezoelectric members 106 shown in FIGS. 27C and 27E, GND electrodes 116A and 116B are alternately formed at ¼-wavelength intervals to be positionally in phase with the electrodes of the A and B phases on the piezoelectric members 102 and 103 above and below the third and fifth piezoelectric members. On the other hand, on an uppermost (first) piezoelectric member 104, polarization and power supply electrodes are formed as six concentrical portions, and two power supply electrodes 114AG and 114BG at the inner periphery side are connected to the electrodes on the third and fifth piezoelectric members 106 via through holes as in the above embodiments. More specifically, the power supply electrode 114AG is connected to the GND electrodes 116A for the A phase via the through holes, and the power supply electrode 114BG is connected to the GND electrodes 116B for the B phase via the through holes. Power supply electrodes 114A(+), 114A(-), 114B(+), and 114B(-) are respectively connected to electrodes 112B(+) (113B(+)), and 112B(-) (113B(-)) having the same phases and same polarities on the second, fourth, and sixth piezoelectric members 102 and 103 via through holes.

The polarization processing method of the stacked piezoelectric member group with the above-mentioned structure is substantially the same as that in the third embodiment described above, except that the two GND power supply electrodes 114AG and 114BG are arranged. When an intermediate potential is supplied to these two GND power supply electrodes 114AG and 114BG, the intermediate potential is applied to the GND electrodes 116A and 116B on the third and fifth piezoelectric members 106.

Figure 28:
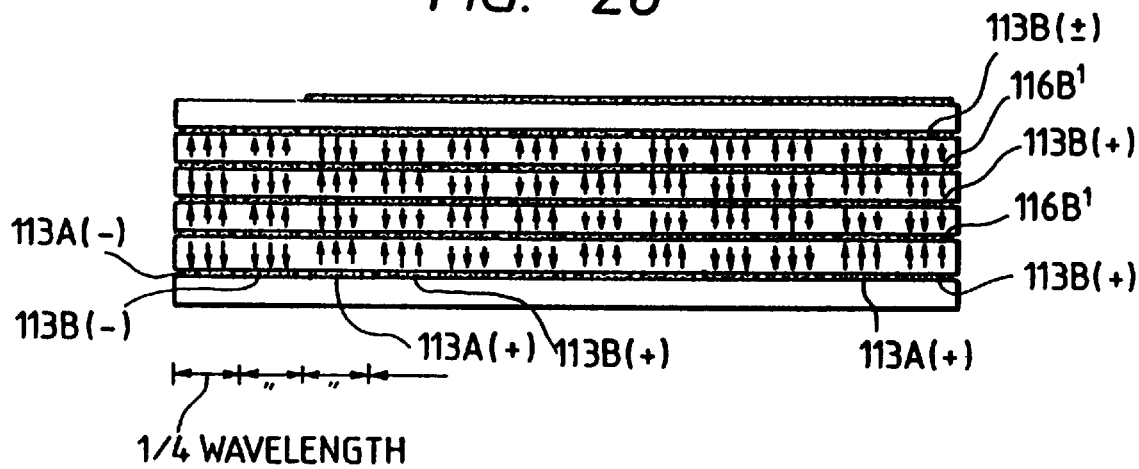
FIG. 28 is a developed view showing the directions of polarization of the stacked piezoelectric member shown in FIGS. 27A to 27F.

When a positive voltage is applied from a driving circuit (not shown) to the power supply electrodes 114A(+) and 114B(+) and a negative voltage is supplied from the driving circuit to the power supply electrodes 114A(-) and 114B(-), the positive and negative voltages are respectively applied to the positive and negative electrodes on the second, fourth, and sixth piezoelectric members 102 and 103. FIG. 28 shows the polarization state of this stacked piezoelectric member group.

Figure 29:
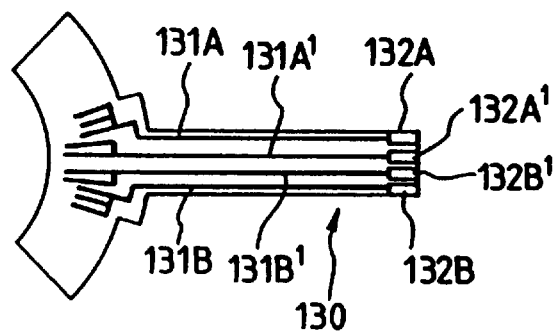
FIG. 29 is a plan view of a flexible printed board for connection used in the stacked piezoelectric member shown in FIGS. 27A to 27F.

A flexible board 130 connected to the power supply electrodes of this stacked piezoelectric member group is designed, as shown in FIG. 29, so that a power supply pattern 131A$^1$ is connected to the GND electrode 114AG, and a power supply pattern 131B$^1$ is connected to the GND electrode 114BG. These two power supply patterns 131A$^1$ and 131B$^1$ receive driving voltages from a driving circuit (not shown) via terminal portions 132A$^1$ and 132B$^1$, as follows.

More specifically, a phase difference between driving frequency voltages applied to a terminal portion 132A electrically connected to the power supply electrodes 114A(+) and 114A(-) and a terminal portion 132B electrically connected to the power supply electrodes 114B(+) and 114B(-) is +90 deg or -90 deg, but a phase difference between driving frequency voltages applied across the terminal portions 132A and 132A$^1$ and across the terminal portions 132B and 132B$^1$ becomes 180 deg. For this reason, a voltage twice that in the third and fourth embodiments described above is applied to the second, third, fourth, and fifth piezoelectric members (ceramic plates) sandwiched between the GND electrodes 116A and 116B, and the electrodes 112A(+) (113A(+)), 112A(-) (113A(-)), 112B(+) (113B(+)), and 112B(-) (113B(-)). Therefore, a driving operation with a still lower voltage can be realized.

In order to reduce the number of wiring lines in the polarization processing, the electrodes 114A(+) and 114B(+), 114A(-) and 114B(-), and 114AG and 114BG may be connected via non-used portions, and these connection portions may be cut after the polarization processing as in the third and fourth embodiments. Alternatively, as in the fourth embodiment, electrodes for detecting a vibration state may be divisionally arranged on the first and second layers.

Figure 30:
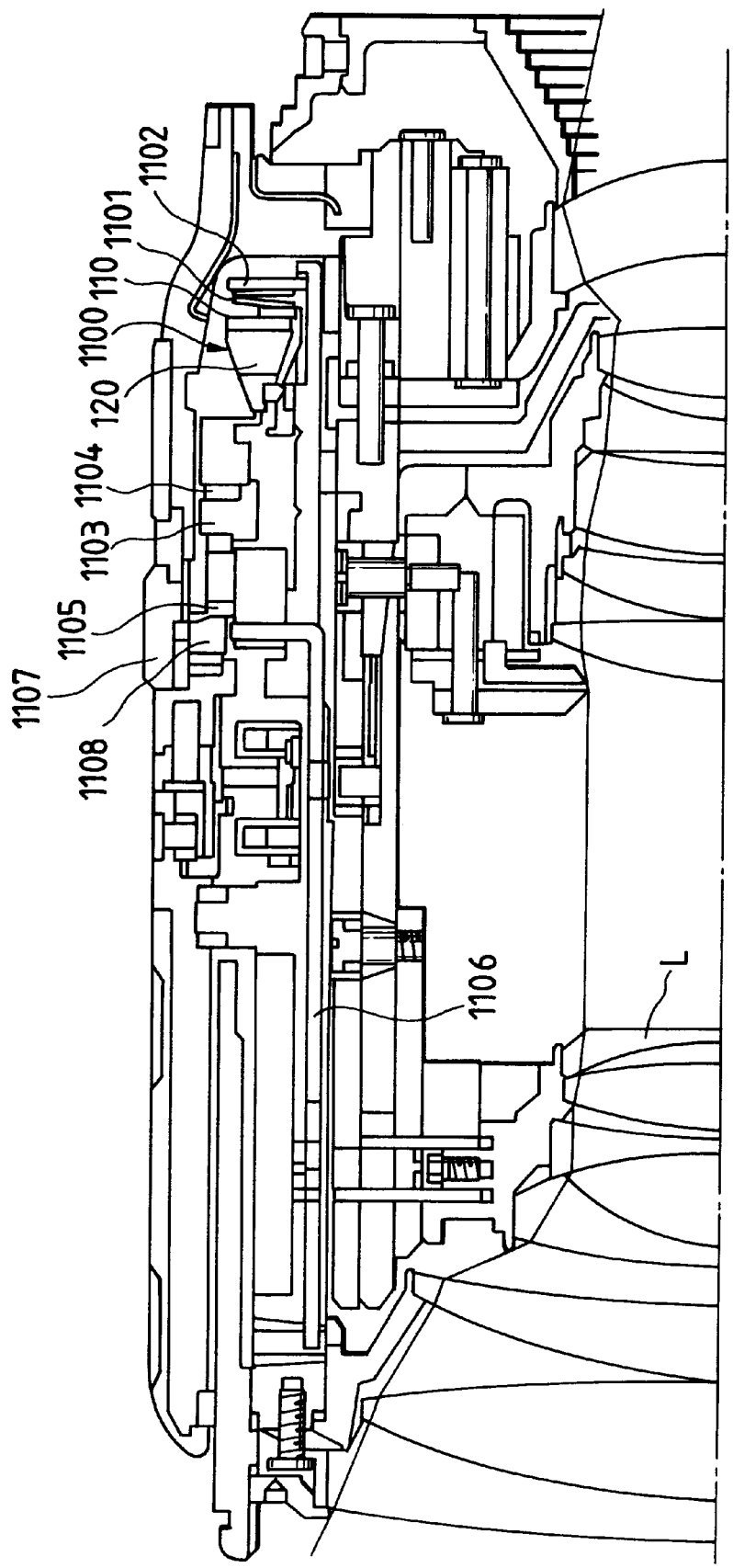
FIG. 30 is a sectional view of a lens barrel which uses an ultrasonic motor using the stacked piezoelectric member of one of the third to fifth embodiments as a driving source.

FIG. 30 shows a lens barrel using, as a driving source, an ultrasonic motor which utilizes the stacked piezoelectric member group in each of the above embodiments.

A vibration member 1100 is constituted by joining a stacked piezoelectric member group 110 to an elastic member 120 shown in, e.g., FIG. 23. The vibration member 1100 contacts a stopper member 1102 via a compression spring 1101. An output member 1103 as a ring-shaped rotor is in press contact with the driving surface of the vibration member 1100 via a friction member 1104. A roller 1105 is coupled to a focusing key 1106, and is rotated about the optical axis to move a focusing lens L in the optical axis direction. The roller 1105 frictionally contacts the output member 1103 from the ultrasonic wave motor and a manual output ring 1108 which is rotated about the optical axis upon coupling with a manual focusing ring 1107 which moves in the optical axis direction to switch the focusing mode between a manual focusing mode and an auto-focusing mode. In the auto-focusing mode in which the manual focusing ring 1107 is not coupled to the manual output ring 1108, the roller 1105 is differentially rotated upon rotation of the output member 1103 to rotate the focusing key 1106, thereby driving the focusing lens L via the ultrasonic wave motor to attain a focusing operation. When the manual focusing ring 1107 is coupled to the manual output ring 1108, if the manual focusing ring 1107 is rotated, the focusing lens L is similarly moved by the focusing key 1106 upon differential rotation of the roller 1105, thus attaining a manual focusing operation.

In each of the above embodiments, the stacked piezoelectric member group is constituted by stacking six piezoelectric members (ceramic plates). However, the present invention is not limited to this. In addition, the number of electrodes formed on piezoelectric members as intermediate layers may be determined in correspondence with the wave number of a required travelling wave.

As described above, the stacked piezoelectric member group according to each of the third to fifth embodiments described above can form a travelling wave upon synthesis of standing waves having one or plural wave number, and can decrease the number of wiring lines required for the polarization processing and a power supply operation for driving.

Since the electrodes on the respective layers are connected via the through holes, an operation for connecting conductive wires to every other layers can be omitted, and projections formed by coating a conductive paint on external edge portions can be avoided.

Furthermore, since the polarization processing and a power supply operation for driving can be performed by only electrodes formed on the uppermost piezoelectric member, the number of wiring lines therefor can be decreased.

On the other hand, as for connections with a driving circuit, since the power supply electrodes are concentrated on a single layer, the area of the connection portion of a flexible board used for connections can be reduced, thus reducing cost and suppressing vibration attenuation caused by a board resin. Therefore, the driving efficiency of a vibration wave driving device such as a vibration wave motor, which uses this piezoelectric member group can be improved.

Of course, since the sensor phase can be provided to this stacked piezoelectric member group, driving control of the vibration wave driving device can be performed with high precision.

Since the stacked piezoelectric member group has no electrode on the outer surface of the lowermost layer, when the stacked piezoelectric member group is joined to a vibration elastic member, the lowermost piezoelectric member can be adhered to the elastic member using an adhesive. Therefore, unlike in the prior art, a conductive paint need not be coated on the side surfaces of the piezoelectric members (ceramic plates) to facilitate connections of the whole-surface electrode formed on the joint surface side to the GND side of a driving circuit.

What is claimed is:

1. A vibration actuator comprising:

a vibration member; and a plurality of electro-mechanical energy conversion elements for generating a vibration in said vibration member, said plurality of electromechanical energy conversion elements including a plurality of first energy conversion elements each having at least four divided electrodes provided on one side of each respective first energy conversion element and arranged in respective regions of said plurality of first energy conversion elements, each of said plurality of first electromechanical energy conversion elements being polarized in at least two groups having different directions of polarization, said plurality of first energy conversion elements being stacked, so that each side of each of said first energy conversion elements contacts at least four divided electrodes, and wherein respective divided electrodes which are in phase with each other are connected in the respective regions of said energy conversion elements to attain electrical connections therebetween, whereby a first signal supplied to divided electrodes of a first group of said plurality of first energy conversion elements also is supplied to respective divided electrodes of said plurality of first energy conversion elements which are in phase with each other, and a second signal supplied to divided electrodes of a second group of said plurality of first energy conversion elements also is supplied to respective divided electrodes of said plurality of first energy conversion elements which are in phase with each other.

2. An actuator according to claim 1, wherein said plurality of electromechanical energy conversion elements are adhered in a stacked state, and substantially constitute a block.

3. An actuator according to claim 2, wherein each of said plurality of electromechanical energy conversion elements has a hollow ring shape, and is contacted with said vibration member having a bar shape.

4. An actuator according to claim 1, further comprising a mechano-electric energy conversion element stacked on said plurality of electromechanical energy conversion elements.

5. An actuator according to claim 4, wherein said plurality of electromechanical energy conversion elements and said mechano-electric energy conversion element are adhered in a stacked state, and substantially constitute a block.

6. An actuator according to claim 1, further comprising:

an equipment having a moving device which uses said vibration actuator as a driving source.

7. An actuator according to claim 1, wherein a connection region used for a polarization process is cuttable after the polarization process to provide separate electrode portions.

8. An actuator according to claim 1, wherein each of said plurality of electro-mechanical energy conversion elements has a hollow ring shape, and is contacted with said vibration member having a bar shape.

9. An actuator according to claim 1, further comprising:

a circuit board arranged between said plurality of electromechanical energy conversion elements and said vibration member, said circuit board having respective divided electrode regions for supplying potentials to the divided electrodes of said plurality of first energy conversion elements.

10. An actuator according to claim 1, further comprising:

a contact member contacting said vibration member, said vibration member and said contact member being relatively moved by a vibration generated in said vibration member.

11. An actuator according to claim 1, wherein respective divided electrodes which are in phase with each other are connected via through holes.

12. An actuator according to claim 1, further comprising:

an equipment having a moving device which uses said vibration actuator as a driving source.

13. An actuator according to claim 12, wherein said equipment for moving a movable lens by said vibration actuator is a lens barrel.

14. An actuator according to claim 1, further comprising:

supply means for supplying a potential to said plurality of first energy conversion elements.

15. An actuator according to claim 1, wherein some of said divided electrodes on at least one of said plurality of first energy conversion elements are concentrated on substantially one portion.

* * * * *

UNITED STATES PATENT AND TRADEMARK OFFICE
CERTIFICATE OF CORRECTION

PATENT NO. : 6,051,911
DATED : April 18, 2000
INVENTOR(S) : Nobuyuki Kojima, et al.

Page 1 of 2

It is certified that error appears in the above-identified patent and that said Letters Patent is hereby corrected as shown below:

[56] References Cited

FOREIGN PATENT DOCUMENTS

"4-91677   3/1992 .....   H02N  2/00
4-091677  3/1992 .....   H020  2/00" should be deleted.

"117354" should read -- 1-17354 --.
" 6165540" should read -- 6-165540 --.
"5175567 should read -- 5-175567 --.

Column 3
Line 67, "piezoelectric," should read -- piezoelectric --.

Column 6
Line 62, "100 MO," should read -- 100 M$\Omega$, --.

Column 8
Line 7, "$\alpha \int_s d \cdot E \cdot ds \cdot h$" should read -- $\alpha \propto \int_s d \cdot E \cdot ds \cdot h$ --.
Line 11, "$\beta \int_s d \cdot E \cdot ds \cdot h$" should read -- $\beta \propto \int_s d \cdot E \cdot ds \cdot h$ --.

Column 10
Line 7, "layer" should read -- layers --.

Column 12
Line 42, "for" should read -- for the --.

UNITED STATES PATENT AND TRADEMARK OFFICE
CERTIFICATE OF CORRECTION

PATENT NO. : 6,051,911
DATED : April 18, 2000
INVENTOR(S) : Nobuyuki Kojima, et al.

It is certified that error appears in the above-identified patent and that said Letters Patent is hereby corrected as shown below:

Column 16
line 59, "concentrical" should read -- concentric --.
Line 63, "electrode" should read -- electrodes --.

Column 18
Line 60, "layers" should read -- layer --.

Signed and Sealed this

Twenty-first Day of August, 2001

Attest:

NICHOLAS P. GODICI
Attesting Officer   Acting Director of the United States Patent and Trademark Office